United States Patent
Song et al.

(10) Patent No.: US 9,281,482 B2
(45) Date of Patent: Mar. 8, 2016

(54) ORGANIC COMPOUND AND ORGANIC LIGHT EMITTING DIODE USING THE SAME

(71) Applicant: LG Display Co., Ltd, Seoul (KR)

(72) Inventors: In-Bum Song, Seoul (KR); Gee-Sung Chae, Incheon (KR); Joong-Hwan Yang, Gwangmyeong-si (KR); Suk-Young Bae, Seoul (KR); Chun-Ki Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/560,981

(22) Filed: Dec. 4, 2014

(65) Prior Publication Data

US 2015/0162537 A1    Jun. 11, 2015

(30) Foreign Application Priority Data

Dec. 5, 2013 (KR) .................... 10-2013-0150833
Jul. 15, 2014 (KR) .................... 10-2014-0089253

(51) Int. Cl.

| | | |
|---|---|---|
| *H01L 51/54* | (2006.01) | |
| *C09K 11/06* | (2006.01) | |
| *H01L 51/00* | (2006.01) | |
| *H05B 33/14* | (2006.01) | |
| *H01L 51/50* | (2006.01) | |

(52) U.S. Cl.
CPC ............ *H01L 51/0052* (2013.01); *C09K 11/06* (2013.01); *H01L 51/0072* (2013.01); *H05B 33/14* (2013.01); *C09K 2211/1029* (2013.01); *C09K 2211/1044* (2013.01); *C09K 2211/1077* (2013.01); *C09K 2211/1081* (2013.01); *H01L 51/5012* (2013.01); *H01L 51/5056* (2013.01); *H01L 51/5088* (2013.01); *H01L 2251/552* (2013.01)

(58) Field of Classification Search
None
See application file for complete search history.

(56) References Cited

U.S. PATENT DOCUMENTS

| | | | | |
|---|---|---|---|---|
| 6,720,573 | B2 * | 4/2004 | Son et al. .................. | 257/40 |
| 2006/0029828 | A1 * | 2/2006 | Kanno et al. .............. | 428/690 |
| 2007/0205412 | A1 * | 9/2007 | Bae et al. .................. | 257/40 |
| 2008/0014464 | A1 * | 1/2008 | Kawamura et al. ......... | 428/690 |
| 2008/0149923 | A1 * | 6/2008 | Ohsawa et al. ............ | 257/40 |
| 2010/0051914 | A1 * | 3/2010 | Hwang et al. ............. | 257/40 |
| 2011/0017983 | A1 | 1/2011 | Mizuki et al. | |
| 2012/0280214 | A1 * | 11/2012 | Makino et al. ............ | 257/40 |

FOREIGN PATENT DOCUMENTS

| | | | |
|---|---|---|---|
| JP | 2008174661 A | * | 7/2008 |
| JP | 2009209127 A | * | 9/2009 |
| WO | WO 2011152477 A1 | * | 12/2011 |

OTHER PUBLICATIONS

Machine translation of JP2008-174661. Date of publication: Jul. 31, 2008.*
Machine translation of JP2009-209127. Date of publication: Sep. 17, 2009.*

* cited by examiner

*Primary Examiner* — Andrew K Bohaty
(74) *Attorney, Agent, or Firm* — Birch, Stewart, Kolasch & Birch, LLP

(57) ABSTRACT

Discussed is an organic electroluminescent device including a first charge carrying layer being disposed adjacent to a first electrode; and a second charge carrying layer disposed adjacent to a second electrode, wherein the first charge carrying layer includes an emitting part, a hole injection part and a hole transporting part between the hole injection part and the emitting part, wherein at least one of the hole injection part, the hole transporting part and the emitting part includes a host material having an organic compound of Formula:

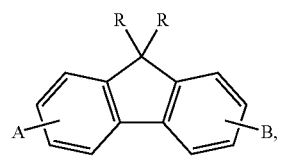

wherein R is substituted or non-substituted C1 to C12 alkyl, and A and B are symmetrically or asymmetrically positioned in 2-position or 7-position of the fluorene core, and wherein each of A and B is independently selected from substituted or non-substituted aromatic group or substituted or non-substituted heterocyclic group.

6 Claims, 3 Drawing Sheets

ORGANIC COMPOUND AND ORGANIC LIGHT EMITTING DIODE USING THE SAME

CROSS-REFERENCE TO RELATED APPLICATIONS

This application claims priority to and the benefit of Korean Patent Application Nos. 10-2013-0150833 and 10-2014-0089253, filed in Korea on Dec. 5, 2013 and Jul. 15, 2014, respectively, all of which are hereby incorporated by reference in their entirety.

BACKGROUND OF THE INVENTION

1. Field of the Invention

The embodiments of the invention relate to an organic light emitting diode (OLED) and more particularly to an organic compound being capable of reducing a driving voltage and being adequate to a simple structure OLED and an OLED including the organic compound.

2. Discussion of the Related Art

Developments in information have led to developments in flat panel display devices as an image displaying device. The flat panel display device includes a liquid crystal display (LCD), a plasma display panel (PDP), a field emission display (FED) and an organic light emitting diode device (OLED), and the flat panel display device meeting the demand for thinness, light-weight and low power consumption are introduced.

Among the flat panel display devices, the OLED has various advantages as compared to the LCD, the PDP and the FED. A flexible substrate, for example, a plastic substrate, can be used as a base substrate for the OLED, and the OLED has excellent characteristics of driving voltage and power consumption.

FIG. 1 is a cross-sectional view of a related art OLED.

As shown in FIG. 1, the OLED 20 is formed on a substrate 10 and includes a first electrode 21 as an anode, a second electrode 27 as a cathode, and an organic emitting layer therebetween. To increase an emission efficiency, the organic emitting layer includes a hole injection layer (HIL) 22, a hole transporting layer (HTL) 23, an emitting material layer (EML) 24 and an electron transporting layer (ETL) 25 and an electron injection layer (EIL) 26.

Holes are provided from the first electrode 21 into the EML 24 through the HIL 22 and the HTL 23, and electrons are provided from the second electrode 27 into the EML 24 through the EIL 26 and the ETL 25.

The holes and the electrons are combined to form excitons, and the excitons are transformed from an excited state to a ground state. As a result, the OLED 20 emits light.

As mentioned above, the OLED requires a plurality of layers to increase the emission efficiency. To prevent the quenching problem of the excitons, the OLED further requires an electron blocking layer and a hole blocking layer. As a result, the production costs of the OLED are increased, and the production yield of the OLED is decreased.

In addition, there are still barriers between adjacent layers. Particularly, there is a hole injection barrier between the HIL 22 and the HTL 23 and/or between the HTL 23 and the ML 24, and the velocity of the electron injection and the electron transporting is larger than that of the hole injection and the hole transporting. Accordingly, the combination of the holes and the electrons is generated in a boundary region between the EML 24 and the HTL 23—not a center region of the EML 24—such that the emission efficiency is decreased and the driving voltage is increased.

To resolve the above problems, the simple structure OLED is required. In addition, a balance of the velocity of the holes and the electrons is required to form the excitons in the center region of the EML.

SUMMARY OF THE INVENTION

Accordingly, the embodiment of the invention is directed to an organic compound and an OLED using the same that substantially obviate one or more of the problems due to limitations and disadvantages of the related art.

An object of the embodiment of the invention is to provide an organic compound being capable of reducing a driving voltage.

An object of the embodiment of the invention is to provide an organic compound being adequate to a simple structure OLED Another object of the embodiment of the invention is to provide an OLED having a simple structure and an improved emission efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the embodiments of the invention, as embodied and broadly described herein, an aspect of an embodiment of the invention provides an organic electroluminescent device including a first electrode; a second electrode facing the first electrode; a first charge carrying layer disposed between the first electrode and the second electrode, the first charge carrying layer being disposed adjacent to the first electrode; and a second charge carrying layer disposed between the first electrode and the second electrode, the second charge carrying layer disposed adjacent to the second electrode, wherein the first charge carrying layer includes an emitting part, a hole injection part and a hole transporting part between the hole injection part and the emitting part, wherein at least one of the hole injection part, the hole transporting part and the emitting part includes a host material having an organic compound of Formula:

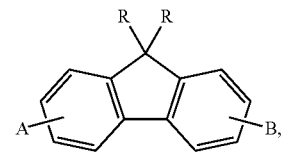

wherein R is substituted or non-substituted C1 to C12 alkyl, and A and B are symmetrically or asymmetrically positioned in 2-position or 7-position of the fluorene core, and wherein each of A and B is independently selected from substituted or non-substituted aromatic group or substituted or non-substituted heterocyclic group.

In another aspect of the embodiment of the invention, provided is an organic electroluminescent device including a first electrode; a second electrode facing the first electrode; a first charge carrying layer disposed between the first electrode and the second electrode, the first charge carrying layer being disposed adjacent to the first electrode; and a second charge carrying layer disposed between the first electrode and the second electrode, the second charge carrying layer disposed adjacent to the second electrode, wherein the first charge carrying layer includes an emitting part, a hole injection part and a hole transporting part between the hole injection part and the emitting part, wherein at least one of the hole injection part, the hole transporting part and the emitting part includes a host material having an organic compound of Formula:

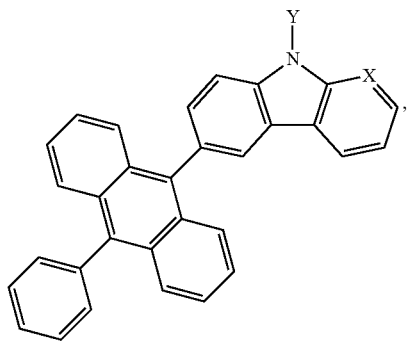

wherein X is selected from carbon, nitrogen, oxygen and sulfur, and Y is selected from aryl and arylamine.

In another aspect of the embodiment of the invention provided is an organic electroluminescent device including a first electrode; a second electrode facing the first electrode; a first charge carrying layer disposed between the first electrode and the second electrode, the first charge carrying layer being disposed adjacent to the first electrode; and a second charge carrying layer disposed between the first electrode and the second electrode, the second charge carrying layer disposed adjacent to the second electrode, wherein the first charge carrying layer includes an emitting part, a hole injection part and a hole transporting part between the hole injection part and the emitting part, and wherein at least two of the emitting part, the hole injection part and the hole transporting part include the same host material.

It is to be understood that both the foregoing general description and the following detailed description are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to example embodiments, examples of which are illustrated in the accompanying drawings.

Figure 1:
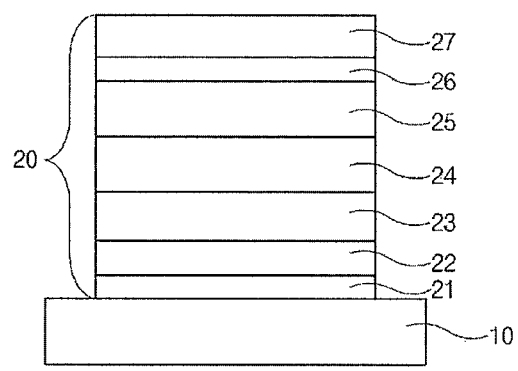
FIG. 1 is a cross-sectional view of the related art OLED.
Figure 2:
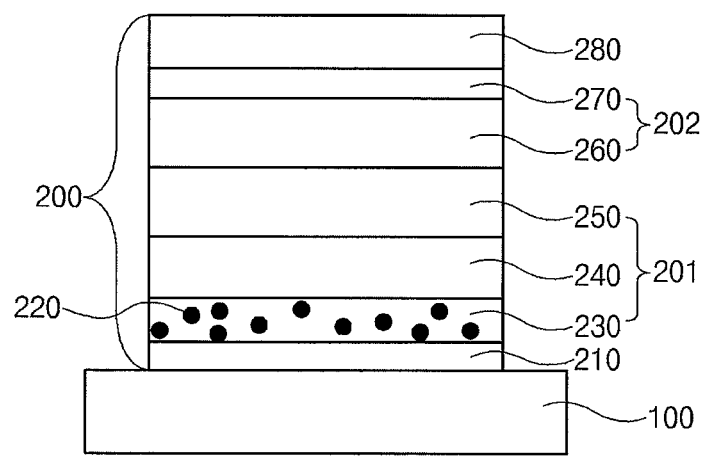
FIG. 2 is a schematic cross-sectional view of an OLED according to a first embodiment of the invention.

FIG. 2 is a schematic cross-sectional view of an OLED according to a first embodiment of the invention.

As shown in FIG. 2, OLED 200 is formed on a substrate 100 and includes a first electrode 210, a hole injection layer (HIL) 230, a hole transporting layer (HTL) 240, an emitting material layer (EML) 250 and an electron transporting layer (ETL) 260, an electron injection layer (EIL) 270 and a second electrode 280.

The first electrode 210 includes a conductive material having a relatively high work function. For example, the first electrode 210 may include indium-tin-oxide (ITO) or indium-zinc-oxide (IZO). However, the material is not limited thereto.

The HIL 230 is formed on the first electrode 210 as an anode, and includes an organic compound in Formula 1. The organic compound in Formula 1 has a hole transporting property.

[Formula 1]

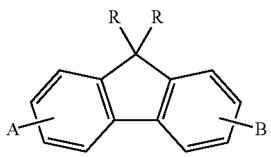

In Formula 1, R is substituted or non-substituted C1 to C12 alkyl. A and B are symmetrically or asymmetrically positioned in 2-position or 7-position of the fluorene core, and each of A and B is independently selected from substituted or non-substituted aromatic group or substituted or non-substituted heterocyclic group.

For example, each of A and B is independently selected from substituted or non-substituted carbazole, substituted or non-substituted α-carboline, substituted or non-substituted β-carboline, substituted or non-substituted γ-carboline, substituted or non-substituted dibenzofuran, substituted or non-substituted dibenzothiophene, substituted or non-substituted aryl amine, substituted or non-substituted aryl silane and substituted or non-substituted phenyl.

Each of A and B is independently selected from the following compounds.

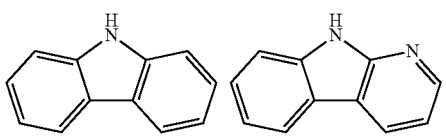

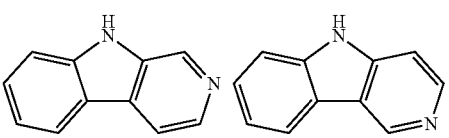

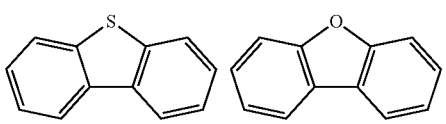

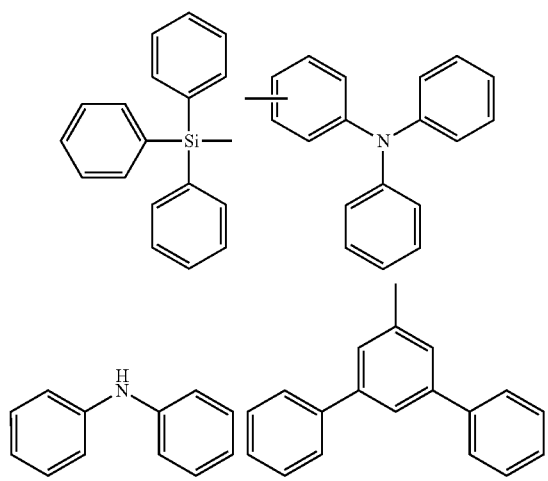
The organic compound in Formula 1 includes the following compounds FL-1 to FL-26.
FL-1
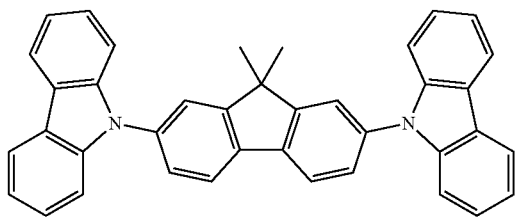
FL-2
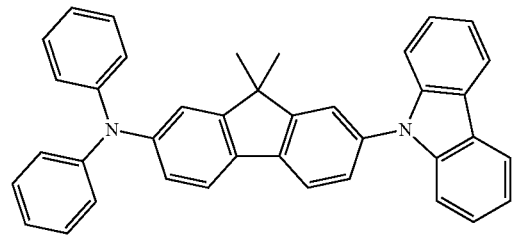
FL-3
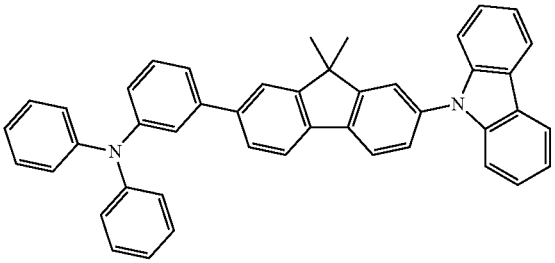
FL-4
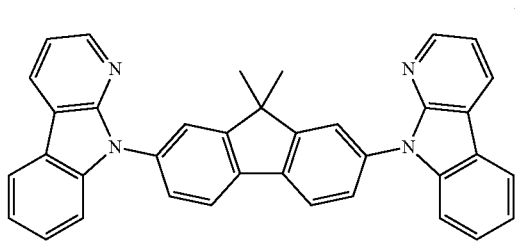
FL-5
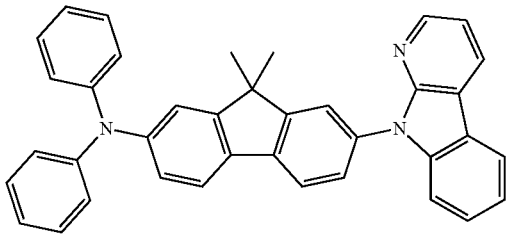
FL-6
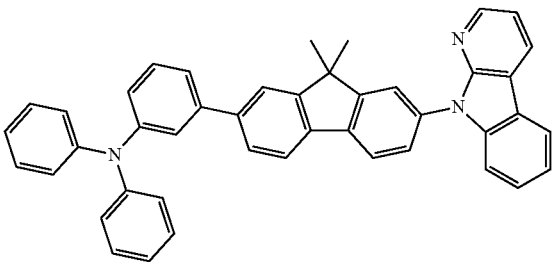
FL-7
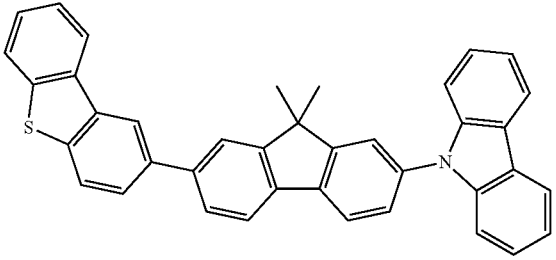
FL-8
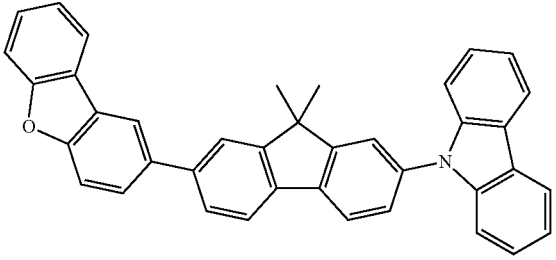
FL-9
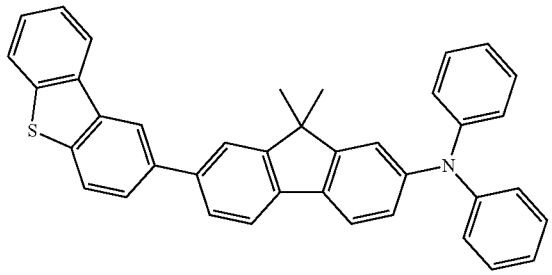

FL-10
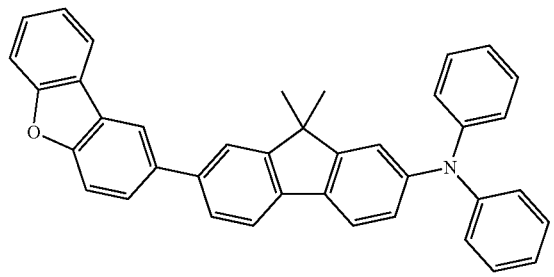
FL-11
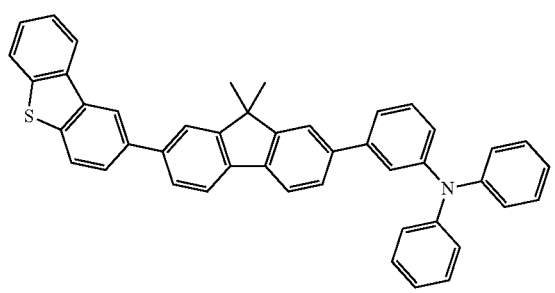
FL-12
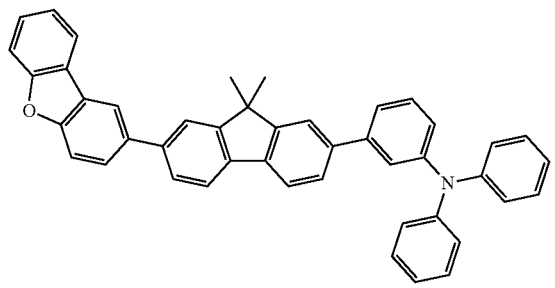
FL-13
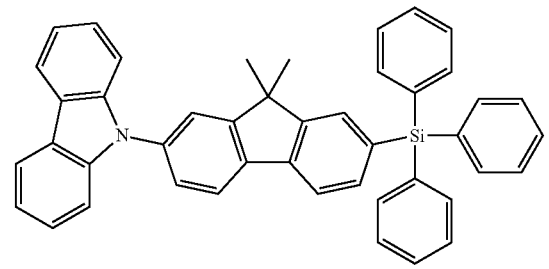
FL-14
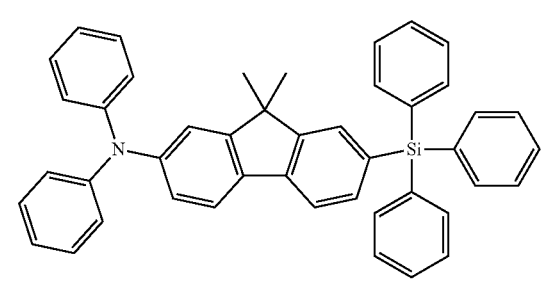
FL-15
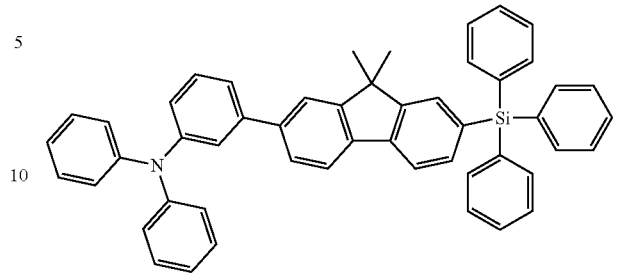
FL-16
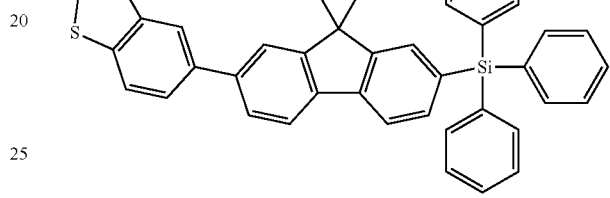
FL-17
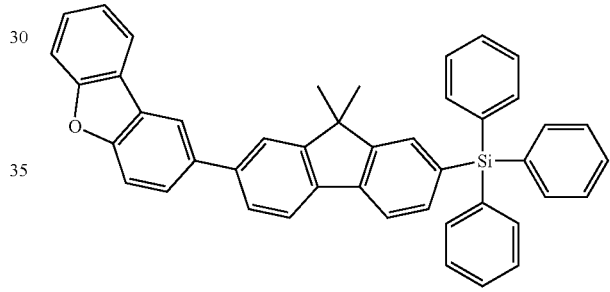
FL-18
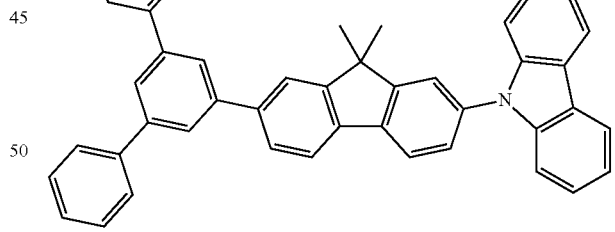
FL-19
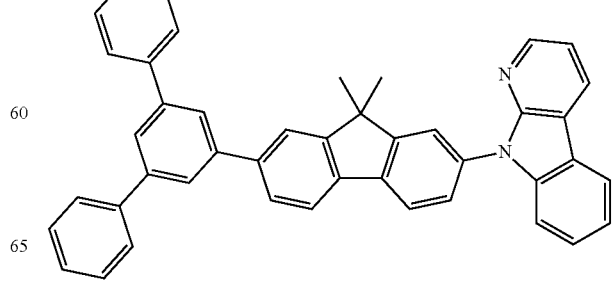

FL-20

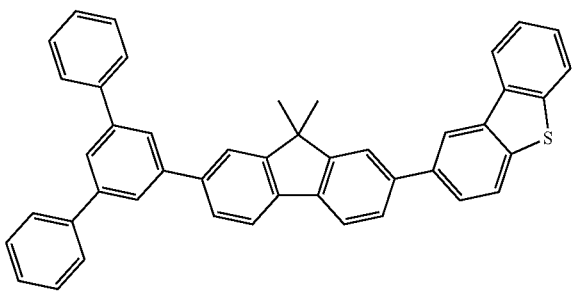

FL-21

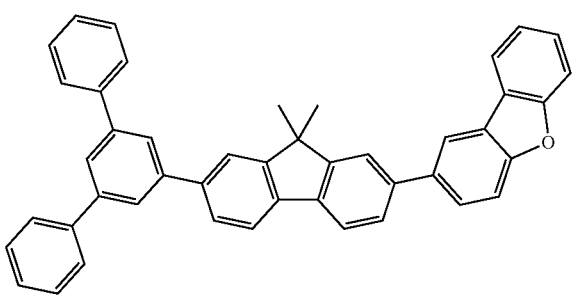

FL-22

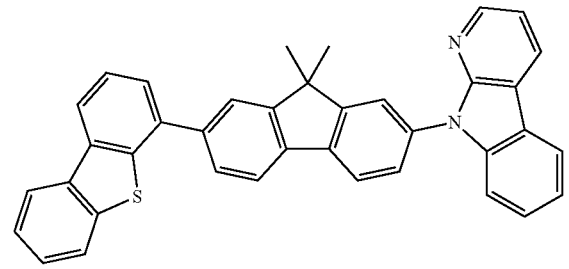

FL-23

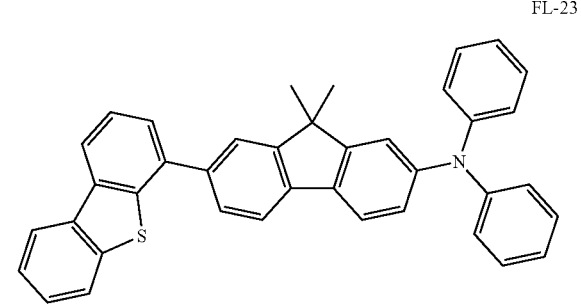

FL-24

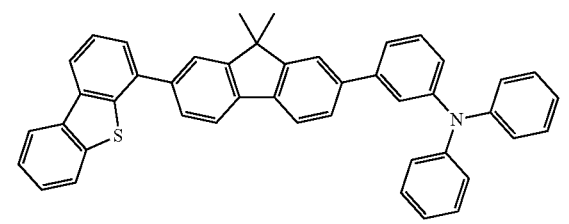

FL-25

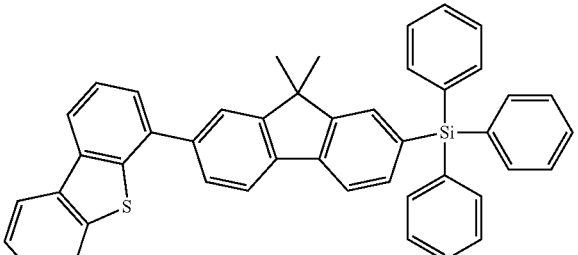

FL-26

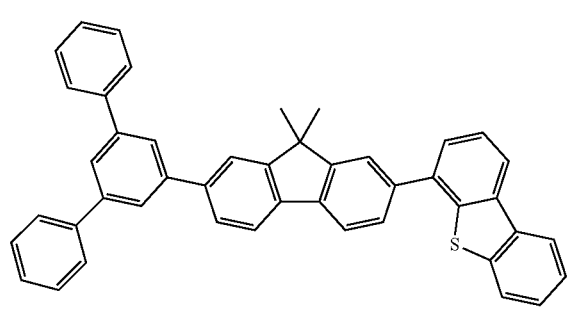

The HIL 230 further includes a dopant material 220 having a lowest unoccupied molecular orbital (LUMO) level of −4.5 eV to −6.0 eV. For example, the dopant material 220 may be an organic compound in Formula 2, but it is not limited thereto. The dopant material 220 may have 0.1 to 20 weight % with respect to a total weight of the HIL 230. Namely, the dopant material 220 is doped to the organic compound in Formula 1 to form the HIL 230 of the OLED 200.

[Formula 2]

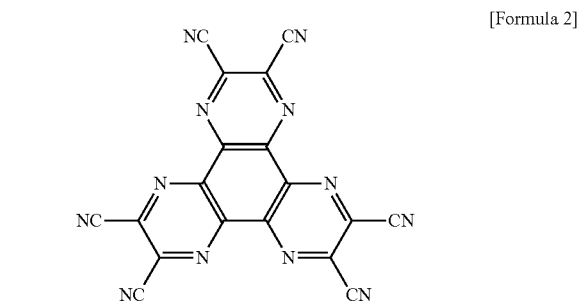 [SMILES: N#Cc1nc2c3nc(C#N)c(C#N)nc3c3nc(C#N)c(C#N)nc3c2nc1C#N]

Synthesis Example

A synthesis example of the organic compound is explained.

1. Synthesis of the Compound FL-1

[Reaction Formula 1]

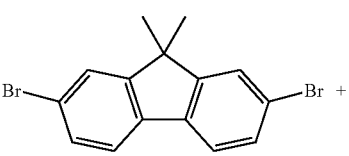

-continued

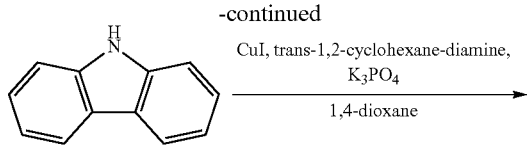

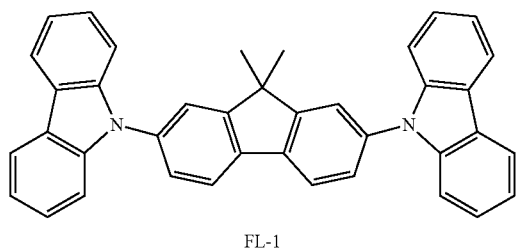

FL-1

2,7-dibromo-9,9-dimethyl-9H-fluorene (10 g, 28.403 mmol), carbazole (9.5 g, 56.806 mmol), copper iodide (CuI) (4.3 g, 22.722 mmol), K₃PO₄ (36 g, 170.418 mmol), and trans-1,2-cyclohexanediamine (2.7 mL, 22.722 mmol) were dissolved in 1,4-dioxane. The solution was refluxed and stirred for 12 hours. After completion of the reaction, the solution was distilled under reduced pressure to remove the solvent. The resultant was columned with a solvent of n-hexane and methylene chloride (4:1) and was short-columned with toluene. The solution was distilled under reduced pressure and was re-crystallized in a solution of methylene chloride and petroleum ether such that the compound FL-1 was obtained, (4.0 g, yield: 67%).

2. Synthesis of the Compound FL-2

[Reaction Formula 2]

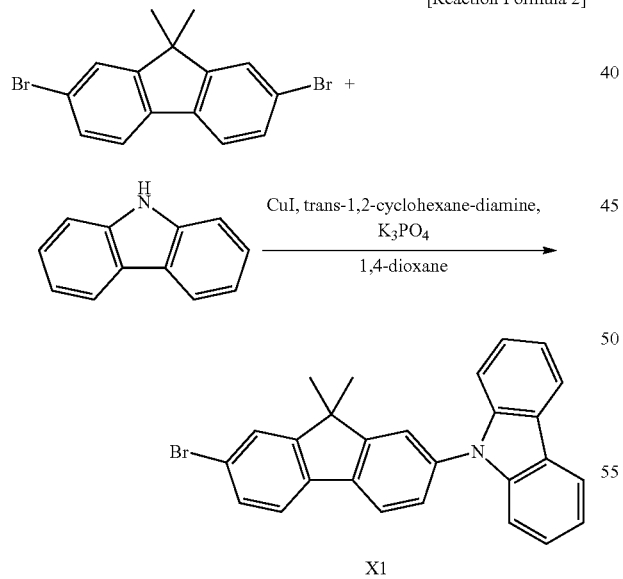

X1

2,7-dibromo-9,9-dimethyl-9H-fluorene (10 g, 28.403 mmol), carbazole (2.37 g, 14.20 mmol), copper iodide (Cup (540 mg, 2.840 mmol), K₃PO₄ (6.03 g, 28.404 mmol), and trans-1,2-cyclohexanediamine (0.34 mL, 2.840 mmol) were dissolved in 1,4-dioxane. The solution was refluxed and stirred for 12 hours. After completion of the reaction, the solution was distilled under reduced pressure to remove the solvent. The resultant was columned with a solvent of n-hexane and methylene chloride (4:1). The solution was distilled under reduced pressure and was re-crystallized in a solution of methylene chloride and petroleum ether such that the compound X1 was obtained, (4.17 g, yield: 67%).

[Reaction Formula 3]

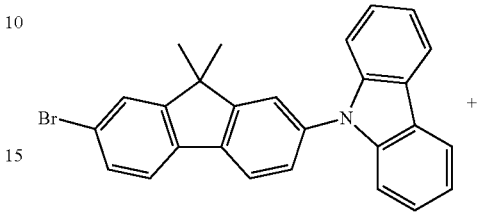

X1

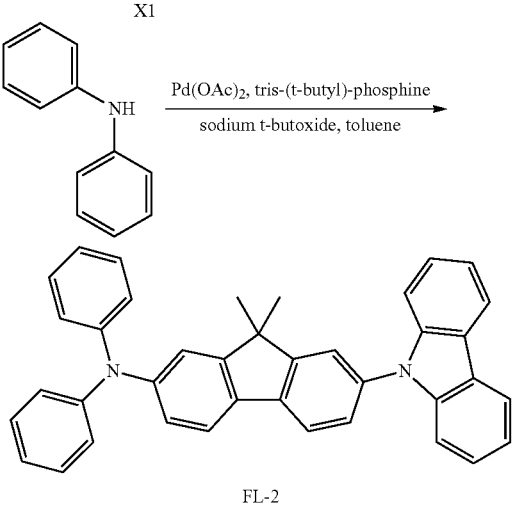

FL-2

The compound X1 (2.0 g, 4.562 mmol), diphenylamine (701 mg, 4.148 mmol), tris-(t-butyl)-phosphine (49 µl, 0.207 mmol), and sodium tert-butoxide (798 mg, 8.296 mmol) were dissolved in toluene. The solution was refluxed and stirred for 12 hours with catalyst of palladium(II)acetate (Pd(OAc)₂). After completion of the reaction, the solution was distilled under reduced pressure to remove the solvent. The resultant was columned with a solvent of n-hexane and methylene chloride (3:1). The solution was distilled under reduced pressure and was re-crystallized in a solution of methylene chloride and petroleum ether such that the compound FL-2 was obtained, (1.5 g, yield: 69%).

3. Synthesis of the Compound FL-3

[Reaction Formula 4]

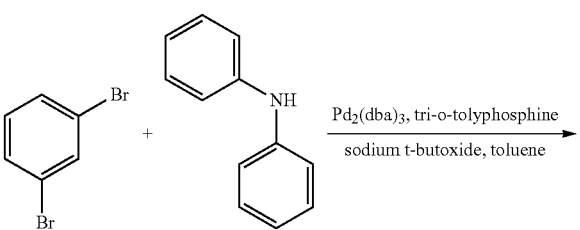

-continued

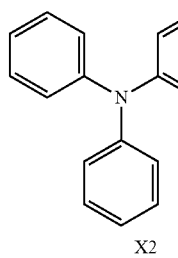

X2

1,3-dibromobenzene (24.9 mL, 206.83 mmol), diphenylamine (10 g, 59.095 mmol), tri-ortho-tolyphosphine (899 mg, 2.955 mmol) and sodium tert-butoxide (11.4 g, 118.19 mmol) were dissolved in toluene. The solution was refluxed and stirred for 12 hours with catalyst of tris(dibenzylideneacetone)dipalladium(0) ($Pd_2(dba)_3$). After completion of the reaction, the solution was distilled under reduced pressure to remove the solvent. The resultant was columned with n-hexane. The solution was distilled under reduced pressure and was re-crystallized in a solution of methylene chloride and petroleum ether such that the compound X2 was obtained, (9.26 g, yield: 48%).

[Reaction Formula 5]

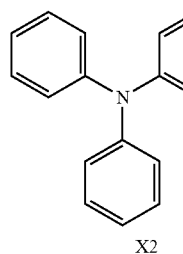

X2

1. n-BuLi, B(OEt)$_2$, THF
2. 5N—HCl

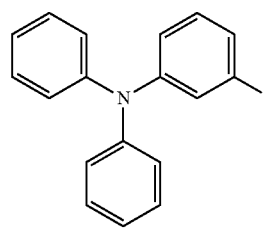

X3

The compound X2 (8.9 g, 27.451 mmol) was dissolved in tetrahydrofuran (THF). The solution was cooled into −78° C., and 2.5M n-butyl lithium (n-BuLi) solution (14.3 mL) was slowly dropped. The solution was stirred in a room temperature for 1 hour. The solution was cooled again into −78° C., and triethyl borate (7.0 mL, 41.176 mmol) was slowly dropped. The solution was stirred in a room temperature for 12 hours. After 12 hours, 5N HCl solution (50 mL) was added, and THF was removed. The resultant was extracted by distilled water and methylene chloride. The resultant was distilled under reduced pressure to remove the solvent and was columned with methylene chloride. The solution was distilled under reduced pressure such that the compound X-3 was obtained, (4.73 g, yield: 60%).

[Reaction Formula 6]

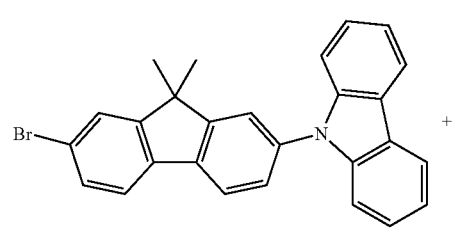

X1

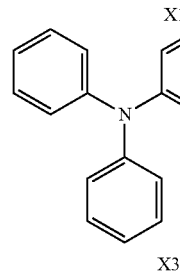

X3

K$_2$CO$_3$, Pd(pph$_3$)$_4$
toluene/H$_2$O

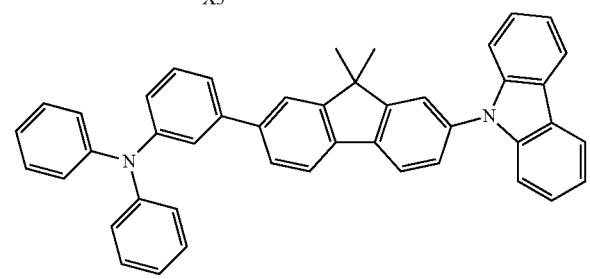

FL-3

The compound X1 (2.06 g, 4.7 mmol), the compound X3 (1.63 g, 5.64 mmol), potassium carbonate (K$_2$CO$_3$) (1.30 mg, 9.4 nnol) were dissolved in toluene and distilled water. The solution was refluxed and stirred for 12 hours with catalyst of tetrakis(triphenylphosphine)palladium(0) (217 mg, 0.19 mmol). After completion of the reaction, the solution was distilled under reduced pressure to remove the solvent. The resultant was columned with a solvent of n-hexane and methylene chloride (4:1). The solution was distilled under reduced pressure and was re-crystallized in a solution of methylene chloride and petroleum ether such that the compound FL-3 was obtained, (0.74 g, yield: 26%).

4. Synthesis of the Compound FL-4

[Reaction Formula 7]

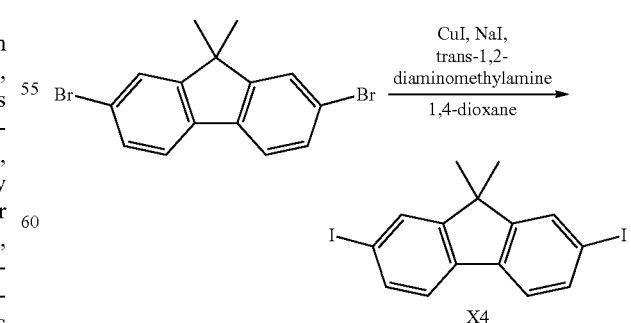

CuI, NaI,
trans-1,2-diaminomethylamine
1,4-dioxane

X4

2,7-dibromo-9,9-dimethyl-9H-fluorene (5.0 g, 14.2 mmol), copper iodide (CuI) (649 mg, 3.41 mmol), sodium iodide (NaI) (8.5 g, 56.804 mmol), and trans-1,2-diaminomethylamine (0.99 mL, 6.25 mmol) were dissolved in 1,4-dioxane. The solution was refluxed and stirred for 12 hours. After completion of the reaction, the solution was distilled under reduced pressure to remove the solvent. The resultant was columned with n-hexane. The solution was distilled under reduced pressure and was re-crystallized in a solution of methylene chloride and petroleum ether such that the compound X4 was obtained, (4.17 g, yield: 65%).

[Reaction Formula 8]

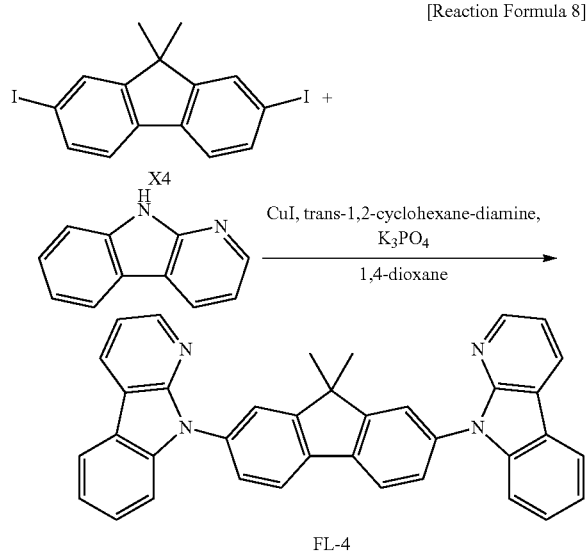

FL-4

The compound X4 (2.5 g, 5.59 mmol), carboline (2.07 g, 12.307 mmol), copper iodide (CuI) (852 mg, 4.48 mmol), $K_3PO_4$ (7.13 g, 33.57 mmol), and trans-1,2-cyclohexanediamine (0.54 mL, 4.48 mmol) were dissolved in 1,4-dioxane. The solution was refluxed and stirred for 12 hours. After completion of the reaction, the solution was distilled under reduced pressure to remove the solvent. The resultant was columned with a solvent of n-hexane and ethylacetate (3:1). The solution was distilled under reduced pressure and was re-crystallized in a solution of methylene chloride and petroleum ether such that the compound FL-4 was obtained, (1.08 g, yield: 37%).

5. Synthesis of the Compound FL-11

(1) Synthesis of 2-(7-bromo-9,9-dimethyl-9H-fluoren-2-yl)dibenzo[b,d]thiophene

[Reaction Formula 9]

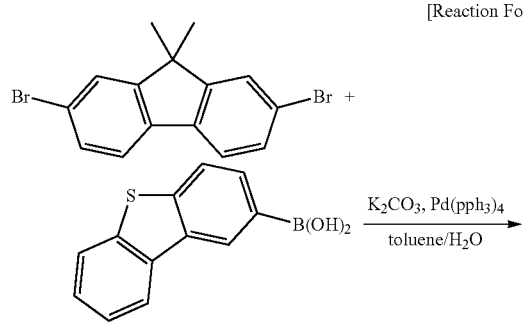

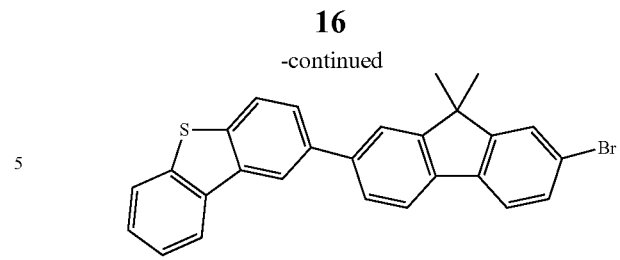

2,7-dibromo-9,9-dimethyl-9H-fluorene (5.0 g, 14.201 mmol), dibenzo[b,d]thiophen-2-ylboronic acid (1.62 g, 7.10 mmol), $Pd(pph_3)_4$ (820 mg, 0.71 mmol), $K_2CO_3$ (1.96 g, 14.201 mmol) were put in a 250 mL two-neck flask and dissolved in toluene/$H_2O$. The solution was refluxed and stirred for 12 hours. After completion of the reaction, the solution was distilled under reduced pressure to remove the solvent. The resultant was columned with a solution of hexane and methylenechloride (9:1). The solution was distilled under reduced pressure and was re-crystallized in a solution of methylene chloride and petroleum ether such that the white solid compound was obtained, (1.61 g, yield: 50%).

(2) Synthesis of the Compound FL-11

[Reaction Formula 10]

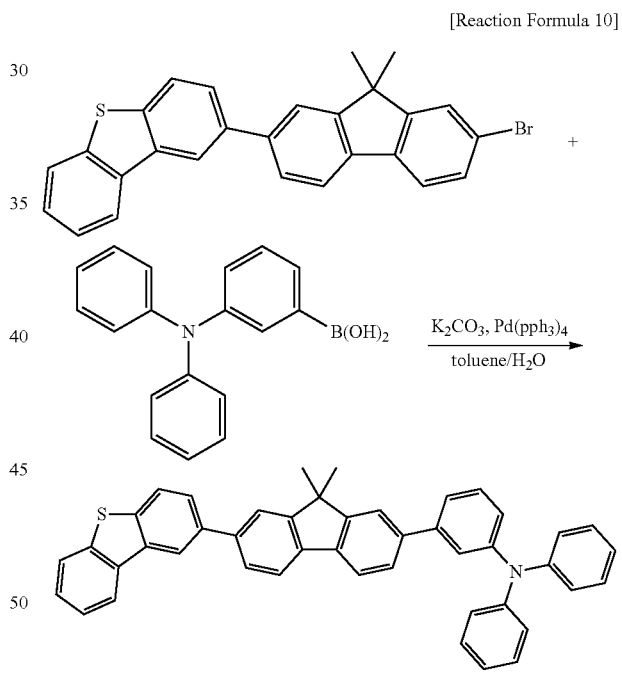

2-(7-bromo-9,9-dimethyl-9H-fluoren-2-yl)dibenzo[b,d]thiophene (1.61 g, 3.54 mmol), 3-(diphenylamino)phenylboronic acid (1.02 g, 3.54 mmol), Pd(pph3)4 (404 mg, 0.35 mmol), $K_2CO_3$ (978 mg, 7.08 mmol) were put in a 250 mL two-neck flask and dissolved in toluene/$H_2O$. The solution was refluxed and stirred for 12 hours. After completion of the reaction, the solution was distilled under reduced pressure to remove the solvent. The resultant was columned with a solution of hexane and methylenechloride (4:1). The solution was distilled under reduced pressure and was re-crystallized in a solution of methylene chloride and petroleum ether such that the compound FL-11 of white solid was obtained, (1.50 g, yield: 68%).

6. Synthesis of the Compound FL-12

(1) Synthesis of 2-(7-bromo-9,9-dimethyl-9H-fluoren-2-yl)dibenzo[b,d]furan

[Reaction Formula 11]

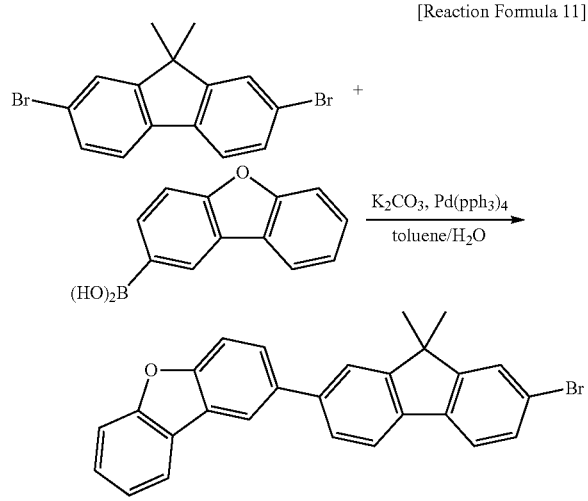

2,7-dibromo-9,9-dimethyl-9H-fluorene (5.0 g, 14.201 mmol), dibenzo[b,d]furan-2-ylboronic acid (1.50 g, 7.10 mmol), Pd(pph3)4 (820 mg, 0.71 mmol), K₂CO₃ (1.96 g, 14.201 mmol) were put in a 250 mL two-neck flask and dissolved in toluene/H₂O. The solution was refluxed and stirred for 12 hours. After completion of the reaction, the solution was distilled under reduced pressure to remove the solvent. The resultant was columned with a solution of hexane and methylenechloride (8:1). The solution was distilled under reduced pressure and was re-crystallized in a solution of methylene chloride and petroleum ether such that the white solid compound was obtained, (1.50 g, yield: 48%).

(2) Synthesis of the Compound FL-12

[Reaction Formula 12]

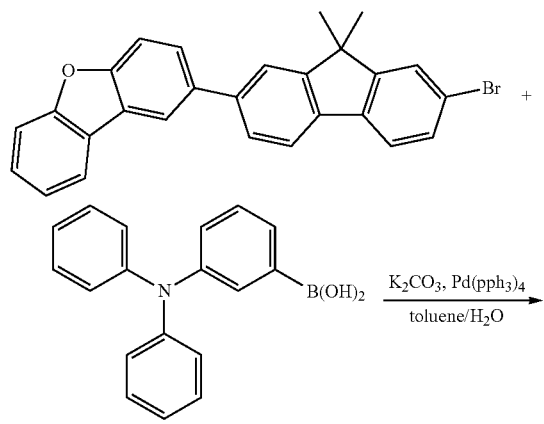

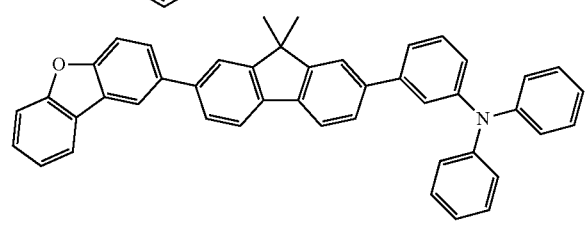

2-(7-bromo-9,9-dimethyl-9H-fluoren-2-yl)dibenzo[b,d]furan (1.50 g, 3.42 mmol), 3-(diphenylamino)phenylboronic acid (989 mg, 3.42 mmol), Pd(pph3)4 (393 mg, 0.34 mmol), K₂CO₃ (945 mg, 6.84 mmol) were put in a 250 mL two-neck flask and dissolved in toluene/H₂O. The solution was refluxed and stirred for 12 hours. After completion of the reaction, the solution was distilled under reduced pressure to remove the solvent. The resultant was columned with a solution of hexane and methylenechloride (3:1). The solution was distilled under reduced pressure and was re-crystallized in a solution of methylene chloride and petroleum ether such that the compound FL-12 of white solid was obtained, (1.20 g, yield: 58%).

7. Synthesis of the Compound FL-15

(1) Synthesis of 3-(7-bromo-9,9-dimethyl-9H-fluoren-2-yl)-N,N-diphenylaniline

[Reaction Formula 13]

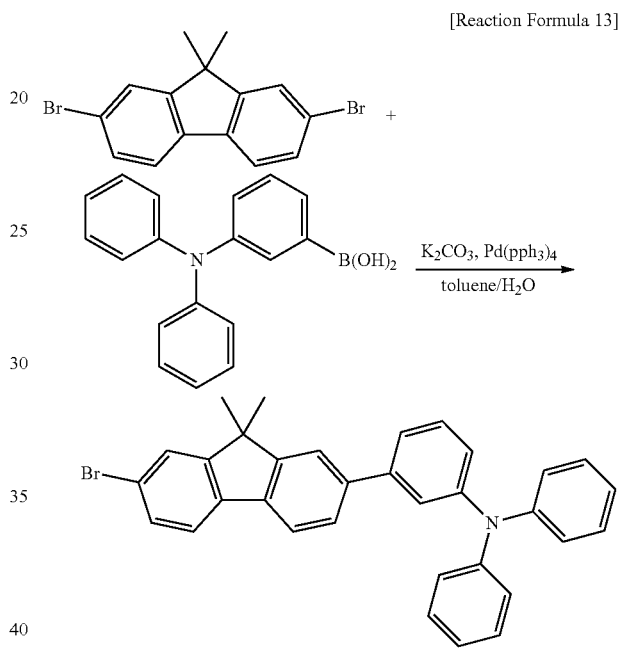

2,7-dibromo-9,9-dimethyl-9H-fluorene (5.0 g, 14.201 mmol), 3-(diphenylamino)phenylboronic acid (2.05 g, 7.10 mmol), Pd(pph3)4 (820 mg, 0.71 mmol), K₂CO₃ (1.96 g, 14.201 mmol) were put in a 250 mL two-neck flask and dissolved in toluene/H₂O. The solution was refluxed and stirred for 12 hours. After completion of the reaction, the solution was distilled under reduced pressure to remove the solvent. The resultant was columned with a solution of hexane and methylenechloride (4:1). The solution was distilled under reduced pressure and was re-crystallized in a solution of methylene chloride and petroleum ether such that the white solid compound was obtained, (1.50 g, yield: 41%).

(2) Synthesis of the Compound FL-15

[Reaction Formula 14]

-continued

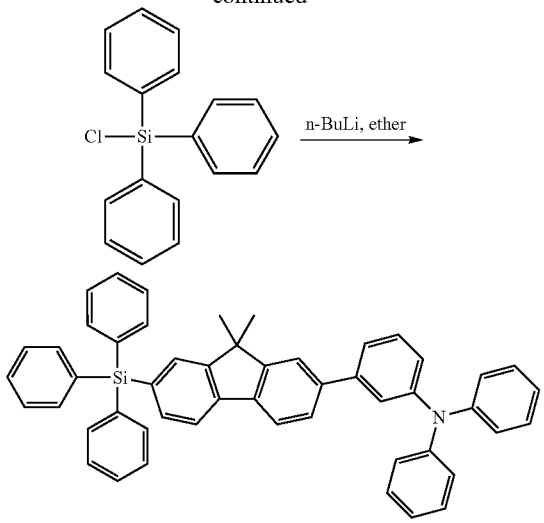

3-(7-bromo-9,9-dimethyl-9H-fluoren-2-yl)-N,N-diphenylaniline (1.50 g, 2.90 mmol) were put in a 250 mL two-neck flask and dissolved in diethylether. The solution was cooled into −78° C., and n-BuLi (2.5M, 1.74 mL) were dropped. After three hours, chlorotriphenylsilane (989 mg, 3.42 mmol) dissolved in diethylether was slowly dropped, and the solution was refluxed and stirred at a room temperature for 12 hours. After completion of the reaction, the solution was distilled under reduced pressure to remove the solvent. The resultant was columned with a solution of hexane and methylenechloride (5:1). The solution was distilled under reduced pressure and was re-crystallized in a solution of methylene chloride and petroleum ether such that the compound FL-15 of white solid was obtained, (1.20 g, yield: 59%).

The properties of the compounds FL-1 to FL-4, FL11, FL-12 and FL-15 and NPB(N,N'-di(naphthalen-1-yl)-N,N'-diphenyl-benzidine) were tested and listed in Table 1.

TABLE 1

| Compounds | $\lambda_{abs}{}^a$ (nm) | $\lambda_{PL}{}^b$ (nm) sol./77K | Band gap Energy $^c$ | LUMO $^d$(eV) | HOMO $^e$ (eV) | $E_T$(eV) |
|---|---|---|---|---|---|---|
| NPB (ref.) | 414 | 540 | 3.00 | −2.40 | −5.40 | 2.30 |
| FL-1 | 360 | 459 | 3.45 | −2.13 | −5.58 | 2.71 |
| FL-2 | 390 | 489 | 3.18 | −2.43 | −5.61 | 2.54 |
| FL-3 | 374 | 491 | 3.32 | −2.33 | −5.65 | 2.53 |
| FL-4 | 354 | 458 | 3.51 | −2.06 | −5.57 | 2.71 |
| FL-11 | 371 | 491 | 3.34 | −2.32 | −5.66 | 2.53 |
| FL-12 | 370 | 487 | 3.35 | −2.33 | −5.68 | 2.55 |
| FL-15 | 372 | 485 | 3.34 | −2.35 | −5.69 | 2.56 |

$^a$Absorption onset of 0.02 mM solutions in $CH_2Cl_2$.
$^b$PL maxima of 2-methyl THF solutions upon excitation at UV maximum absorption.
$^c$Estimated from the absorption onset.
$^d$LUMO = −[Band gap energy − HOMO level]
$^e$Estimated from the Cyclic Voltammetry instrument.

As shown in Table 1, a band gap energy of the compounds FL-1 to FL-4, FL11, FL-12 and FL-15 of the embodiment of the invention is larger than the band gap energy 3.0 of NPB. Accordingly, the organic compound of the embodiment of the invention can be used as a host material of the EML as well as the material of HIL and HTL.

The HTL 240 is formed on the HIL 230. For example, the HTL 240 may include NPB(N,N'-di(naphthalen-1-yl)-N,N'-diphenyl-benzidine), or PD(N,N'-bis-(3-methylphenyl)-N,N'-bis-(phenyl)-benzidine), but it is not limited thereto.

The EML 250 is formed on the HTL 240 and may include a host material with a dopant material, which may be similar or the same as the dopant material 220. Each of the host material and the dopant material is selected from a fluorescent compound and a phosphorescent compound, but it is not limited thereto. For example, for the blue EML 250, the host material may be a fluorescent compound of one of anthracene derivatives, pyrene derivatives and perylene derivatives, and the blue fluorescent dopant may be doped to the host compound. For the green EML 250, the host material may be a phosphorescent compound of one of carbazole derivatives or a metal complex, and the green phosphorescent dopant may be doped to the host compound. For the red EML 250, the host material may be a phosphorescent compound of one of carbazole derivatives or a metal complex, and the red phosphorescent dopant may be doped to the host compound.

The ETL 260 is formed on the EML 250. The ETL 260 includes oxadiazole, triazole, phenanthroline, benzoxazole or benzthiazole, but it is not limited thereto.

The EIL 270 is formed on the ETL 260. The EIL 270 includes LiF or lithium quinolate (LiQ), but it is not limited thereto.

The second electrode 280 is formed on the EIL 270 and includes a metallic material having a relatively low work function. For example, the second electrode 280 may include aluminum (Al), silver (Ag), magnesium (Mg), lithium (Li) or calcium (Ca), but it is not limited thereto.

Figure 3:
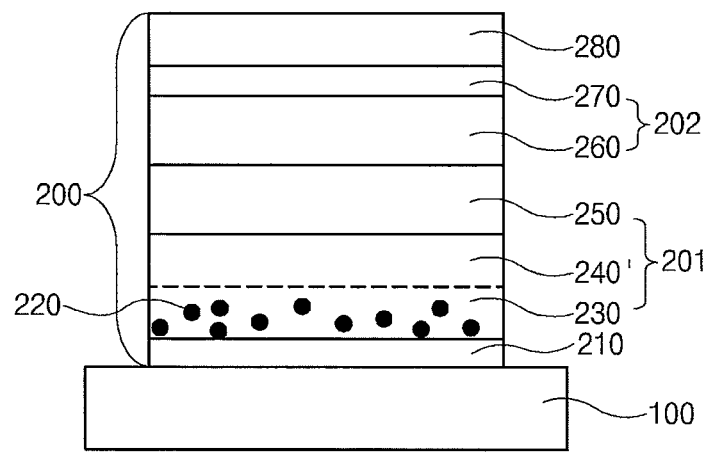
FIG. 3 is a schematic cross-sectional view of an OLED according to a second embodiment of the invention.

FIG. 3 is a schematic cross-sectional view of an OLED according to a second embodiment of the invention. The OLED in FIG. 3 is substantially same as that in FIG. 2 except the material of the HTL. Accordingly, the explanation is focused on the material of the HTL.

As shown in FIG. 3, each of the HIL 230 and the HTL 240' of the OLED 200 of the embodiment of the invention includes the organic compound in Formula 1. As explained above, the HIL 230 further includes the dopant material 220 having the LUMO level of −4.5 eV to −6.0 eV. For example, the dopant material 220 may be an organic compound in Formula 2.

In the OLED 200, there is no hole injection barrier between the HIL 230 and the HTL 240' (indicated by a dashed line), and the driving voltage of the OLED is lowered. In addition, since the HIL 230 and the HTL 240' include the same material, the production costs is decreased and the production yield is improved. The dopant material 220 may have 0.1 to 20 weight % with respect to a total weight of the HIL 230.

Figure 4:
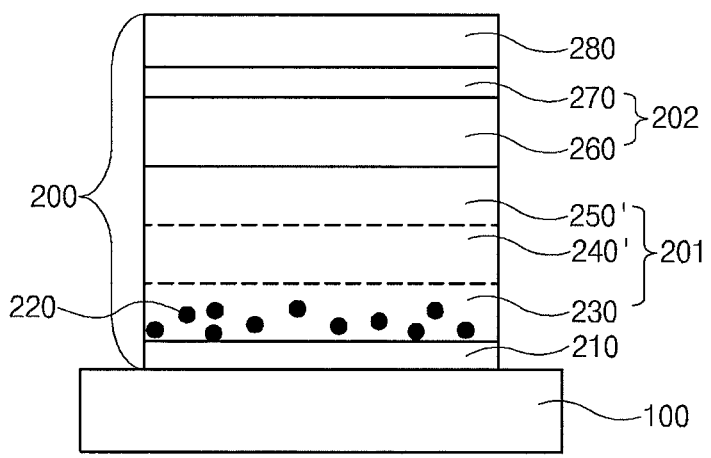
FIG. 4 is a schematic cross-sectional view of an OLED according to a third embodiment of the invention.

FIG. 4 is a schematic cross-sectional view of an OLED according to a third embodiment of the invention. The OLED in FIG. 4 is substantially same as that in FIG. 2 except the material of the HTL and the EML. Accordingly, the explanation is focused on the material of the HTL and EML.

As shown in FIG. 4, not only the HIL 230 and the HTL 240' but also the EML 250' of the OLED 200 of the embodiment of the invention includes the organic compound in Formula 1. As explained above, the HIL 230 further includes the dopant material 220 having the LUMO level of −4.5 eV to −6.0 eV. For example, the dopant material 220 may be an organic compound in Formula 2. The dopant material 220 may have 0.1 to 20 weight % with respect to a total weight of the HIL 230.

In addition, the EML 250' may further include the dopant material to the organic compound in Formula 1 as a host material. The dopant material for the EML 250' may be a fluorescent compound or a phosphorescent compound.

In the OLED 200, there is no hole injection barrier between the HIL 230 and the HTL 240' and between the HTL 240' and the EML 250' (indicated by dashed lines), and the driving voltage of the OLED is lowered. In addition, since the HIL 230, the HTL 240' and the EML 250' include the same material, the production costs is decreased and the production yield is improved. The HIL 230, the HTL 240', and the EML 250' may be referred to as a hole injection part, a hole transport part, and an emitting part in embodiments of the invention, for example, when no hole injection barrier is present therebetween based on one or more of the parts containing a same host material. Also, in embodiments of the invention, the hole injection part, the hole transport part, and the emitting part may be referred together as a first charge carrying layer 201. That is, the first charge carrying layer may include hole injection part, the hole transport part, and the emitting part. Also, in embodiments of the invention, the ETL 260 and the EIL 270 may be referred together as a second charge carrying layer 202. That is, the second charge carrying layer may include the ETL 260 and the EIL 270.

Example 1

1. Example Diode 1

An indium-tin-oxide (ITO) layer is patterned on a substrate and washed such that an emission area of the ITO layer is to be 3 mm*3 mm. The substrate is washed by the UV ozone and is loaded in an evaporation system. The substrate is loaded in a vacuum chamber, and the process pressure is adjusted to $1*10^{-6} \sim 1*10^{-7}$ torr. The compound FL-1 as a host material is deposited with HAT-CN in Formula 2 (10%) as a dopant material to form the HIL (50 Å). NPB is deposited on the HIL to form the HTL (600 Å). MADN (2-methyl-9,10-bis(naphthalene-2-yl)anthracene) is deposited on the HTL to form the EML (250 Å). NPB is deposited on the EML to form the hole blocking layer (100 Å). Aluminum is deposited on the hole blocking layer to form the cathode (1500 Å). The UV curable epoxy and the getter are used for encapsulation such that the diode is obtained.

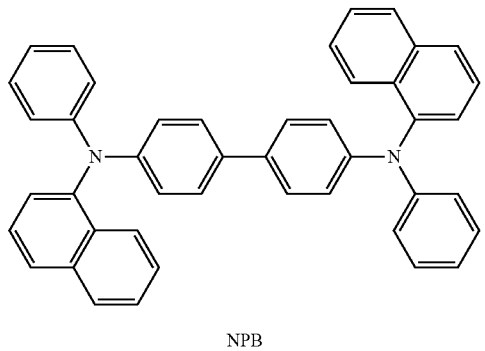

NPB

-continued

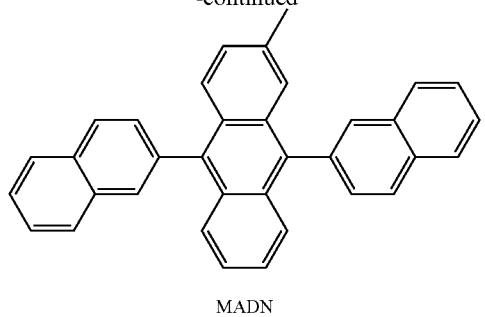

MADN

2. Example Diode 2

The compound FL-2 is used instead of the compound FL-1.

3. Comparative Example Diode 1

The HIL is formed by depositing HAT-CN without the host material in the HIL of the Example diode 1.

4. Comparative Example Diode 2

NPB is used instead of the host material in the HIL of the Example diode 1.

Figure 5:
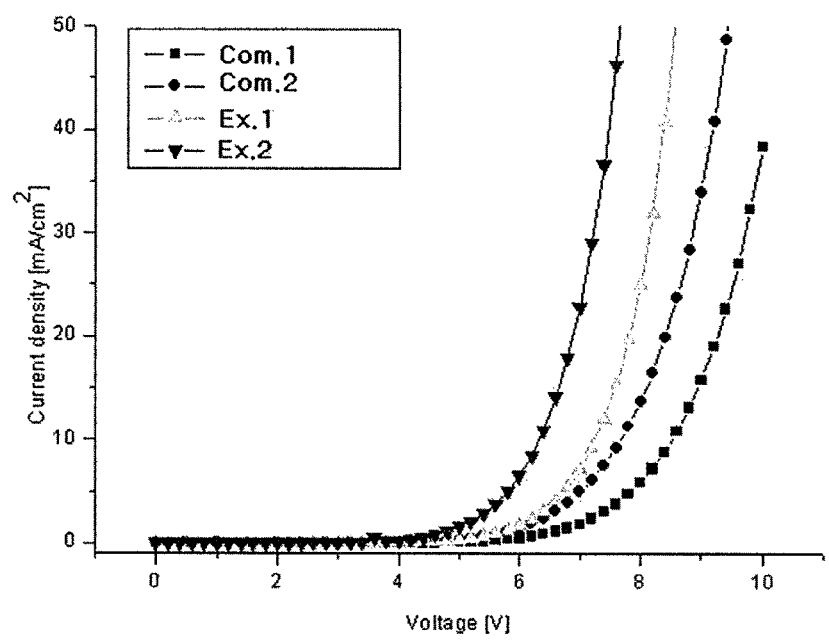
FIG. 5 is a graph showing a current density according to a driving voltage in an OLED of an example 1 of the embodiment of the invention.

The current and voltage property in the Example diodes 1 and 2 and the Comparative Example diodes 1 and 2 were tested and shown in FIG. 5.

As shown in FIG. 5, in comparison to the Comparative Example diode 1, where only HAT-CN is used for the HIL, the driving voltage of the Comparative Example diode 2, where NPB with HAT-CN is used for the HIL, is lowered. At 10 mA/cm2, the Comparative Example diode 1 has the driving voltage of 8.5V, and the Comparative Example diode 2 has the driving voltage of 7.7V.

In addition, in comparison to the Comparative Example diodes 1 and 2, the driving voltage of the Example diodes 1 and 2, where each of the compounds FL-1 and FL-2 with HAT-CN is used for the HIL, is lowered. At 10 mA/cm2, the Example diode 1 has the driving voltage of 7.3V, and the Example diode 2 has the driving voltage of 6.3V.

Example 2

1. Example Diode 3

An indium-tin-oxide (ITO) layer is patterned on a substrate and washed such that an emission area of the ITO layer is to be 3 mm*3 mm. The substrate is washed by the UV ozone and is loaded in an evaporation system. The substrate is loaded in a vacuum chamber, and the process pressure is adjusted to $1*10^{-6} \sim 1*10^{-7}$ torr. The compound FL-1 as a host material is deposited with HAT-CN in Formula 2 (10%) as a dopant material to form the HIL (50 Å). Only the compound FL-1 is deposited on the HIL to form the HTL (300 Å). The compound FL-1 as a host material with 4,48-bis(2,28-diphenylvinyl)-1,18-biphenyl (DPVBi) (15%) as a dopant material is deposited on the HTL to form the EML (400 Å). Alq$_3$ is deposited on the EML to form ETL (200 Å), and LiF is deposited on the ETL to form the EIL (10 Å). Aluminum is deposited on the EIL to form the cathode (1000 Å). The UV curable epoxy and the getter are used for encapsulation such that the diode is obtained.

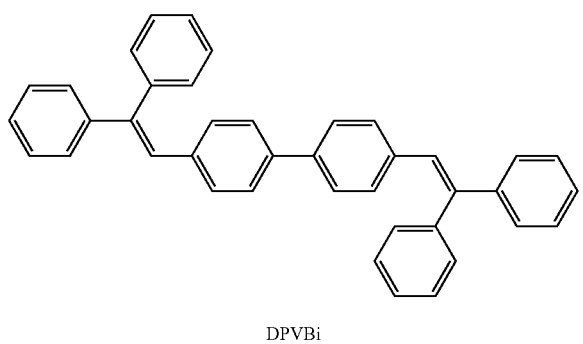 [SMILES: C(=C(c1ccccc1)c1ccccc1)c1ccc(-c2ccc(C=C(c3ccccc3)c3ccccc3)cc2)cc1 ; "DPVBi"]

DPVBi

2. Example Diode 4

The compound FL-2 is used instead of the compound FL-1 in the Example diode 3.

3. Example Diode 5

The compound FL-11 is used instead of the compound FL-1 in the Example diode 3.

4. Example Diode 6

The compound FL-12 is used instead of the compound FL-1 in the Example diode 3.

5. Example Diode 7

The compound FL-15 is used instead of the compound FL-1 in the Example diode 3.

6. Comparative Example Diode

NPB is used instead of the compound FL-1 in the Example diode 3.

The properties of the Example diodes 3 to 7 and the Comparative Example diode were tested and listed in Table 2.

TABLE 2

| | Voltage | Emission efficiency | | Quantum efficiency | | |
|---|---|---|---|---|---|---|
| | [V] | Cd/A | Lm/W | [%] | CIEx | CIEy |
| Com. Ex. | 3.19 | 1.01 | 0.99 | 1.17 | 0.144 | 0.098 |
| Ex.1 | 3.20 | 3.30 | 3.24 | 3.70 | 0.142 | 0.110 |
| Ex.2 | 3.07 | 3.50 | 3.58 | 4.06 | 0.141 | 0.108 |
| Ex.3 | 3.10 | 1.73 | 1.75 | 2.02 | 0.143 | 0.098 |
| Ex.4 | 3.10 | 1.72 | 1.74 | 2.00 | 0.144 | 0.098 |
| Ex.5 | 3.10 | 1.33 | 1.35 | 1.57 | 0.142 | 0.098 |

Referring to Table 2, in comparison to the Comparative Example diode, the properties of the Example diodes 3 to 7 (listed as Ex. 1 to 5, respectively in Table 2) using the organic compound of the embodiment of the invention are improved. Particularly, the emission efficiency and the quantum efficiency of the Example diode 4 (listed as Ex. 2) are remarkably improved, and the driving voltage of the Example diode 4 (listed as Ex. 2) is remarkably lowered.

In the embodiment of the invention, the organic compound, which has large band gap energy and an excellent hole transporting property, is used for the host material of the HIL and EML and the material of the HTL such that the OLED has a simple structure and problems in the production costs and the production yield are overcome. In addition, the dopant material, which has a deep LUMO level, is used for the HIL such that the emission efficiency is improved and the driving voltage is reduced.

The HIL 230 in FIG. 2, the HIL 230 and the HTL 240' in FIG. 3 and the HIL 230, the HTL 240' and the EML 250' in FIG. 4 include an organic compound in Formula 3 instead of the organic compound in Formula 1. The HIL 230 may further include a dopant material having a lowest unoccupied molecular orbital (LUMO) level of −4.5 eV to −6.0 eV. For example, the dopant material may be HAT-CN, which has 0.1 to 20 weight % with respect to a total weight of the HIL 230. The EML 250' may further include a blue dopant material having 0.1 to 30 weight % with respect to a total weight of the EML 250' to emit blue light. For example, the dopant material for the EML 250' may be N,N'-bis(2,4-diphenyl)-N,N'-bis(2-fluorophenyl)-pyrene-1,6-diamine.

Namely, in the OLED including the first electrode, the HIL, the HTL, the EML and the second electrode, at least one of the HIL, the HTL and the EML includes the organic compound in Formula 3 such that the OLED has advantages in the emission efficiency, the quantum efficiency and the driving voltage. Particularly, all of the HIL, the HTL and the EML include the organic compound in Formula 3 such that the structure of the OLED is simplified and the problems in the production costs and the production yield are overcome.

In addition, when all of the HIL, the HTL and the EML include the organic compound in Formula 3, which has an excellent hole transporting property, the hole injection or transporting barrier is reduced such that the emission efficiency is further improved. Namely, since the hole injection or transporting barrier is reduced, the combination of the holes and the electrons is generated at a center region of the EML such that the emission efficiency is improved.

[Formula 3]

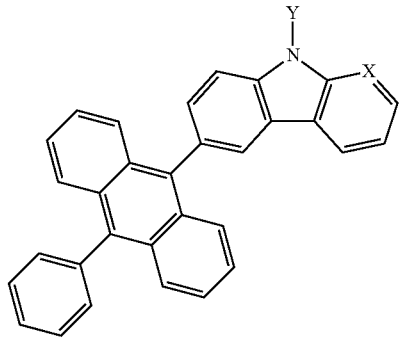

In Formula 3, X is selected from carbon, nitrogen, oxygen and sulfur, and Y is selected from aryl and arylamine. For example, Y may be selected from phenyl, naphthyl, terphenyl, xylene, triphenlyamine, diphenylamine and phenanthrenylamine.

In Formula 2, Y is selected from the followings.

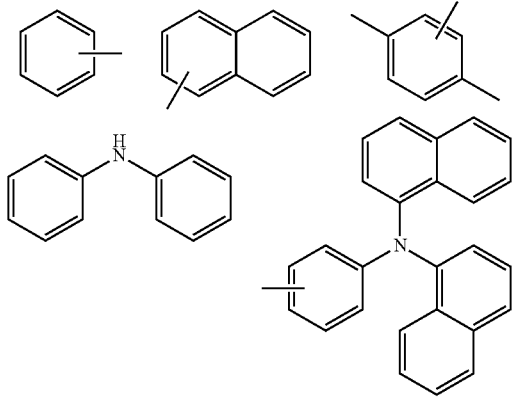

-continued
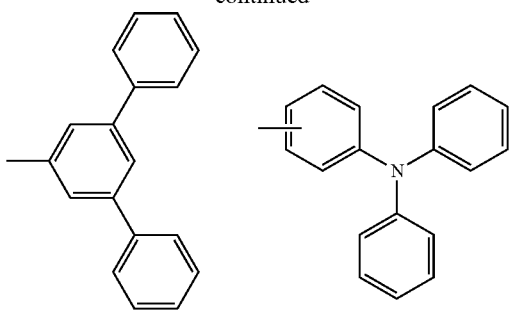
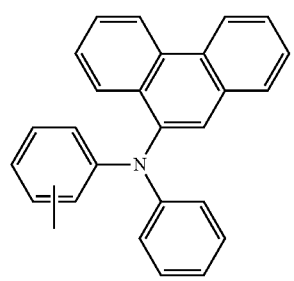
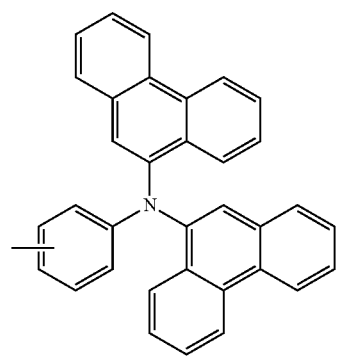
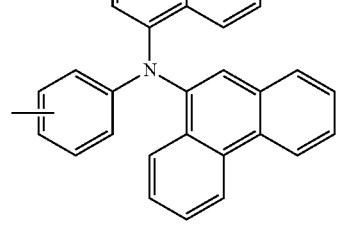
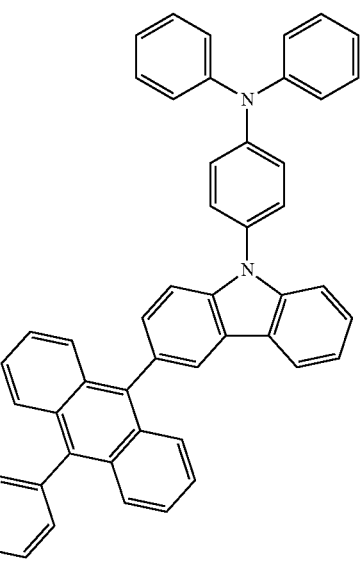
For example, the organic compound in Formula 3 includes the following compounds AN-1 to AN-16.
AN-1
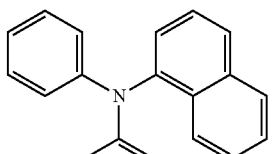
-continued
AN-2
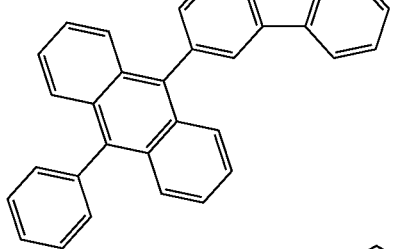
AN-3
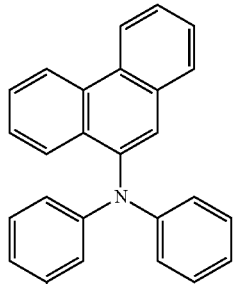
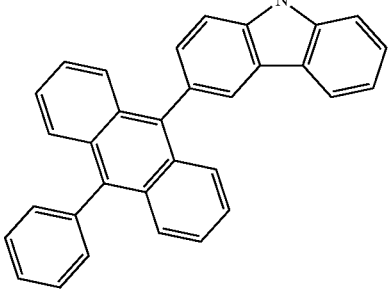
AN-4
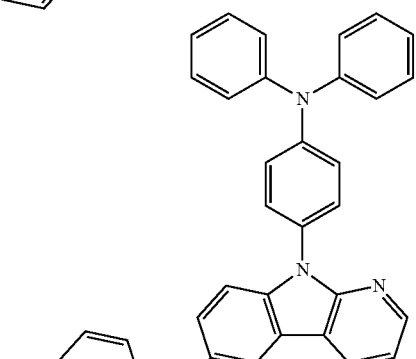
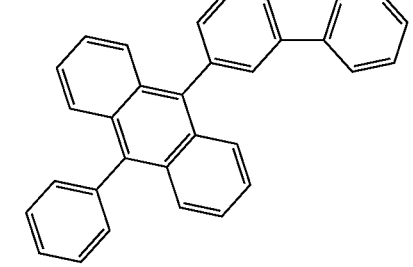

AN-5
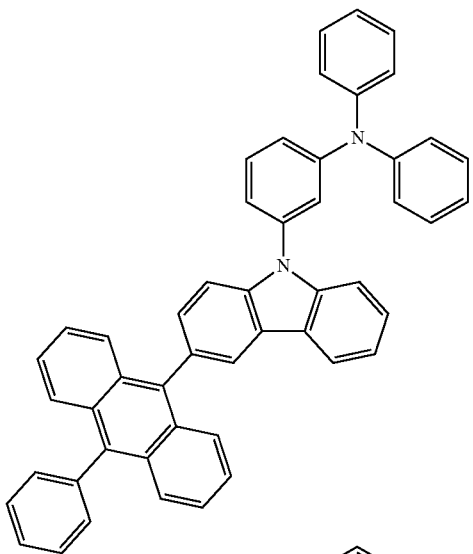
AN-6
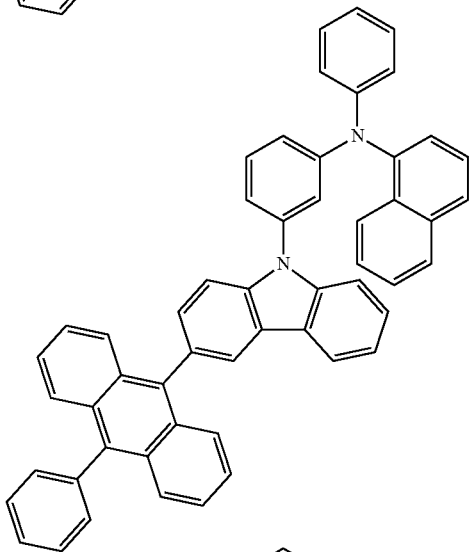
AN-7
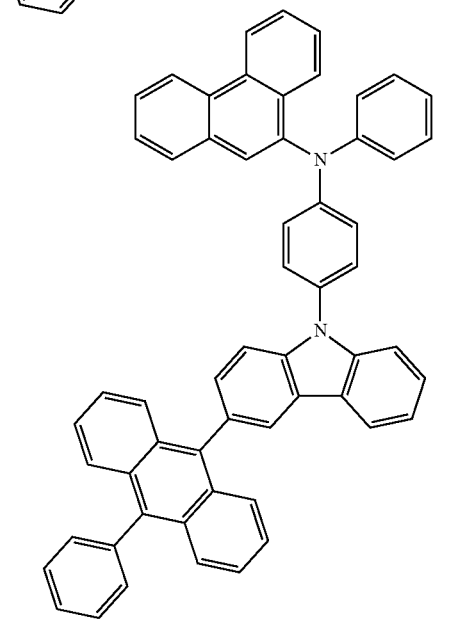
AN-8
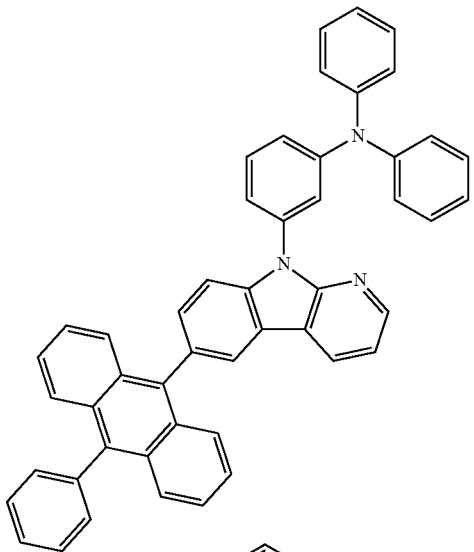
AN-9
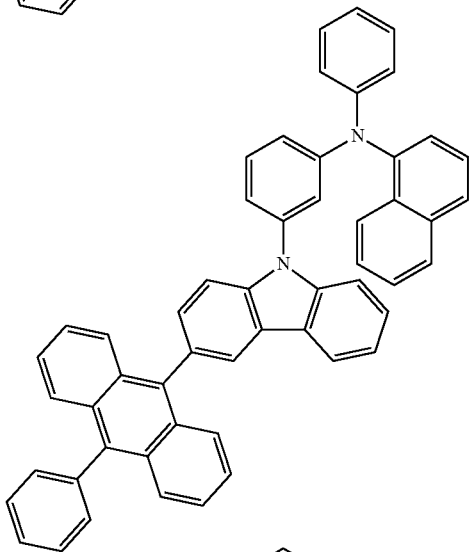
AN-10
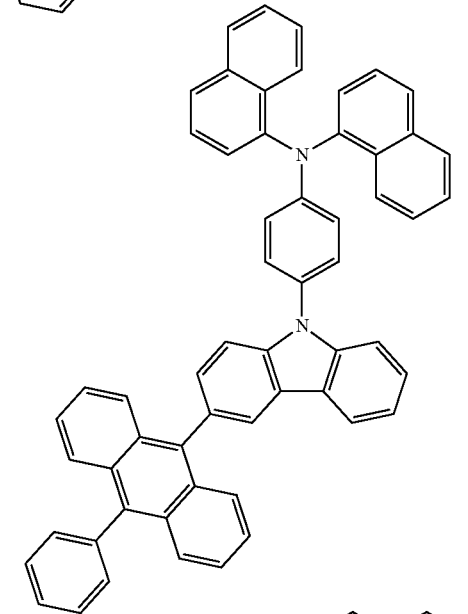

AN-11
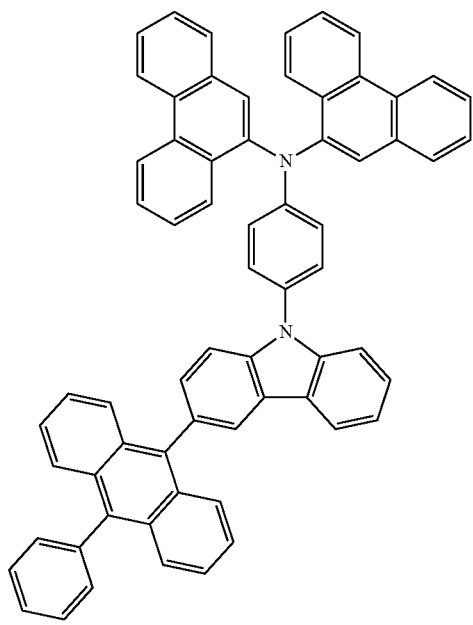
AN-13
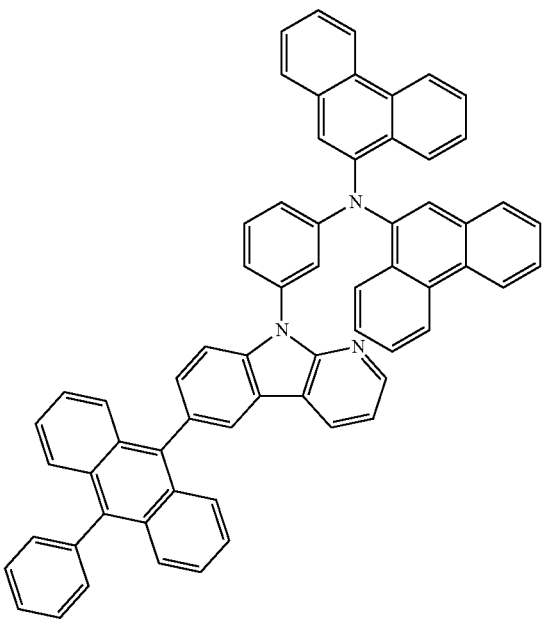
AN-12
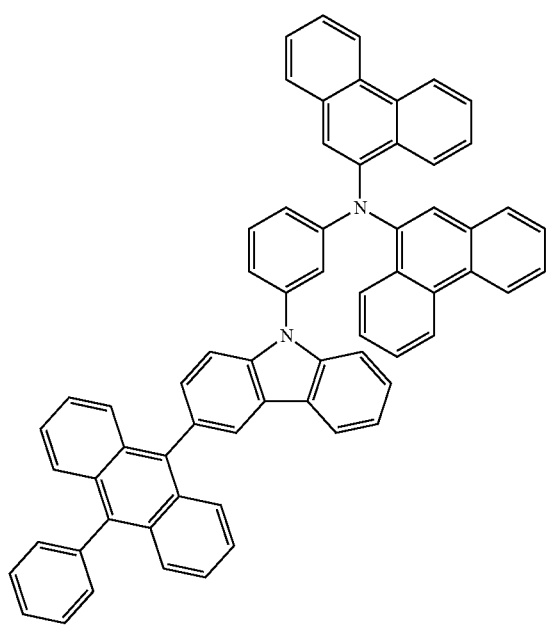
AN-14
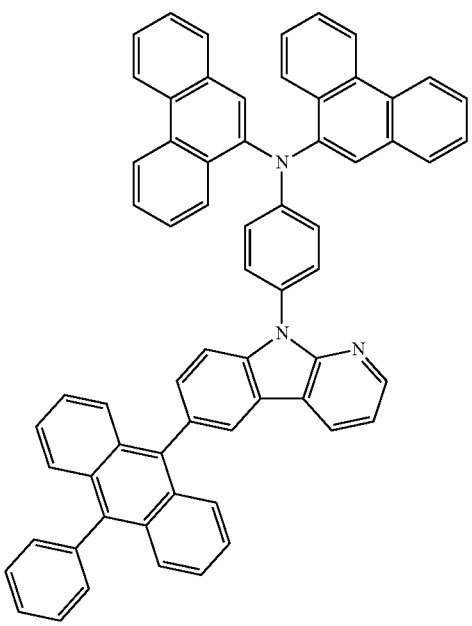

AN-15

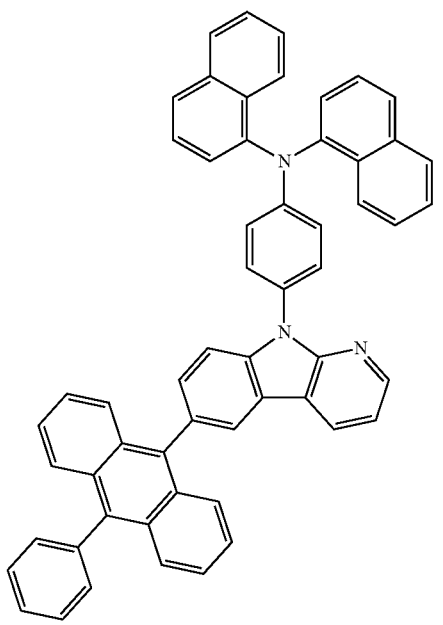

AN-16

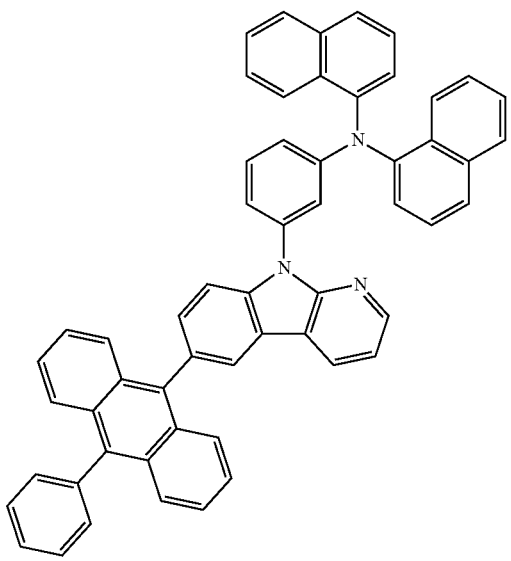

Synthesis Example

A synthesis example of the organic compound is explained.

1. Synthesis of the Compound AN-1

(1) synthesis of
3-(10-phenylanthracen-9-yl)-9H-carbazole

[Reaction Formula 15]

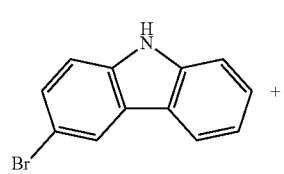

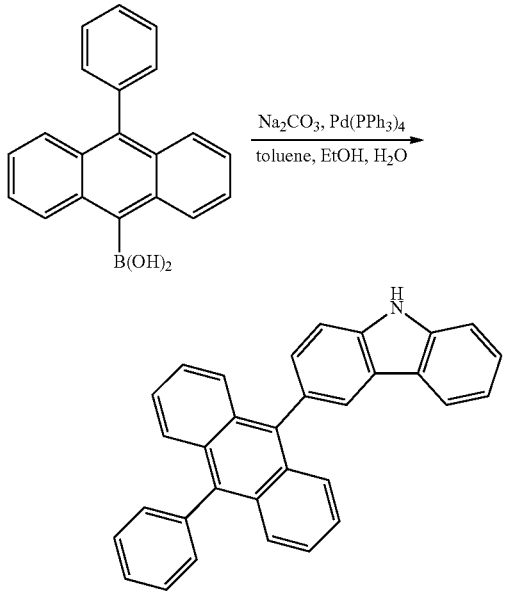

3-bromocarbazole (2.54 g, 10.320 mmol), 9-phenyl-boronic acid (3.69 g, 12.384 mmol), $Na_2CO_3$ (2.2 g, 20.64 mmol), $Pd(PPh_3)_4$ (1.19 g, 1.032 mmol) were put in a 250 mL two-neck flask and dissolved in toluene/ethanol/$H_2O$. The solution was refluxed and stirred at 120° C. for 12 hours. After completion of the reaction, the solution was extracted with methylenechloride/$H_2O$ and distilled under reduced pressure to remove the solvent. The resultant was columned with a solution of n-hexane and methylenechloride (4:1) and was re-crystallized in a solution of methylene chloride and petroleum ether such that the white solid compound was obtained, (2.60 g, yield: 60%).

(2) Synthesis of the Compound AN-1

[Reaction Formula 16]

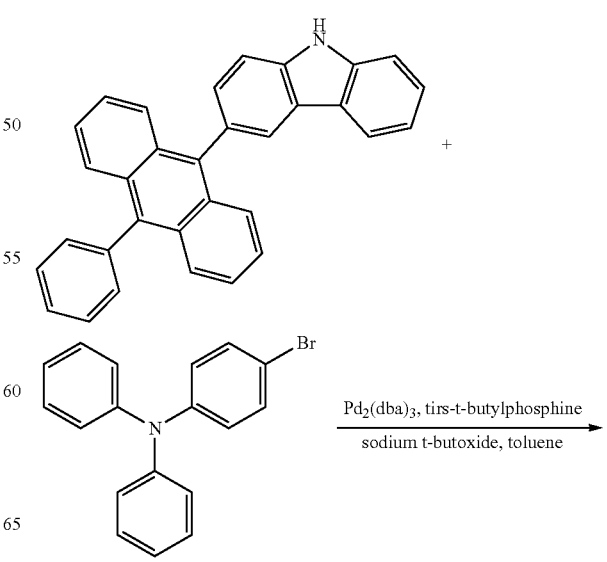

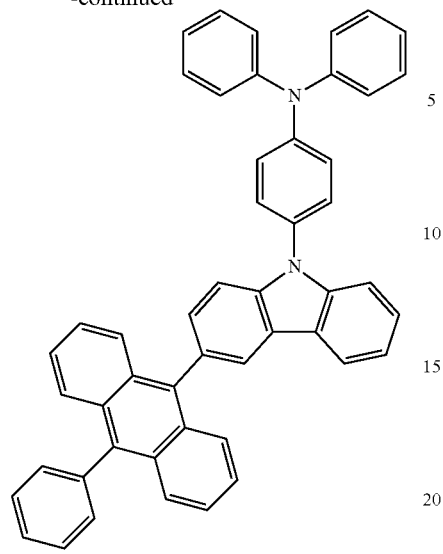

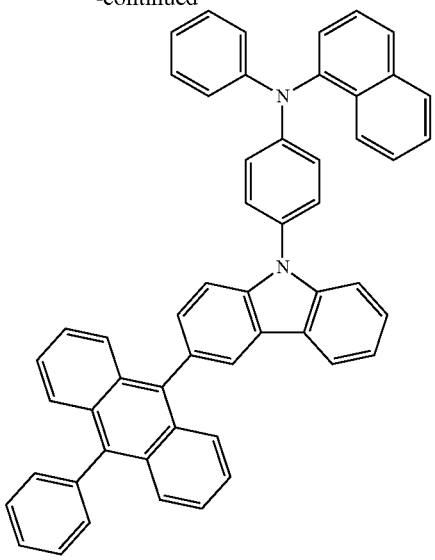

3-(10-phenylanthracen-9-yl)-9H-carbazole (1.68 g, 4.00 mmol), 4-bromo-triphenylamine (1.43 g, 4.401 mmol), Pd$_2$(dba)$_3$ (110 mg, 0.120 mmol), tris-t-butylphosphine (47 μl, 0.200 mmol), sodium tert-butoxide (770 mg, 8.00 mmol) were put in a 250 mL two-neck flask and dissolved in toluene. The solution was refluxed and stirred for 12 hours. After completion of the reaction, the solution was distilled under reduced pressure to remove the solvent. The resultant was columned with a solution of n-hexane and methylenechloride (4:1) and was re-crystallized in a solution of methylene chloride and petroleum ether such that the white solid compound AN-1 was obtained, (2.53 g, yield: 95%).

2. Synthesis of the Compound AN-2

3-(10-phenylanthracen-9-yl)-9H-carbazole (1.59 g, 3.80 mmol), N-(4-bromophenyl)-N-phenyl-naphthalen-1-amine (1.56 g, 4.17 mmol), Pd$_2$(dba)$_3$ (69 mg, 0.076 mmol), tris-t-butylphosphine (27 μl, 0.114 mmol), sodium tert-butoxide (728 mg, 7.58 mmol) were put in a 250 mL two-neck flask and dissolved in toluene. The solution was refluxed and stirred for 12 hours. After completion of the reaction, the solution was distilled under reduced pressure to remove the solvent. The resultant was columned with a solution of n-hexane and methylenechloride (3:1) and was re-crystallized in a solution of methylene chloride and petroleum ether such that the greenish solid compound AN-2 was obtained, (1.64 g, yield: 61%).

3. Synthesis of the Compound AN-3

(1) synthesis of N-phenylphenanthren-9-amine

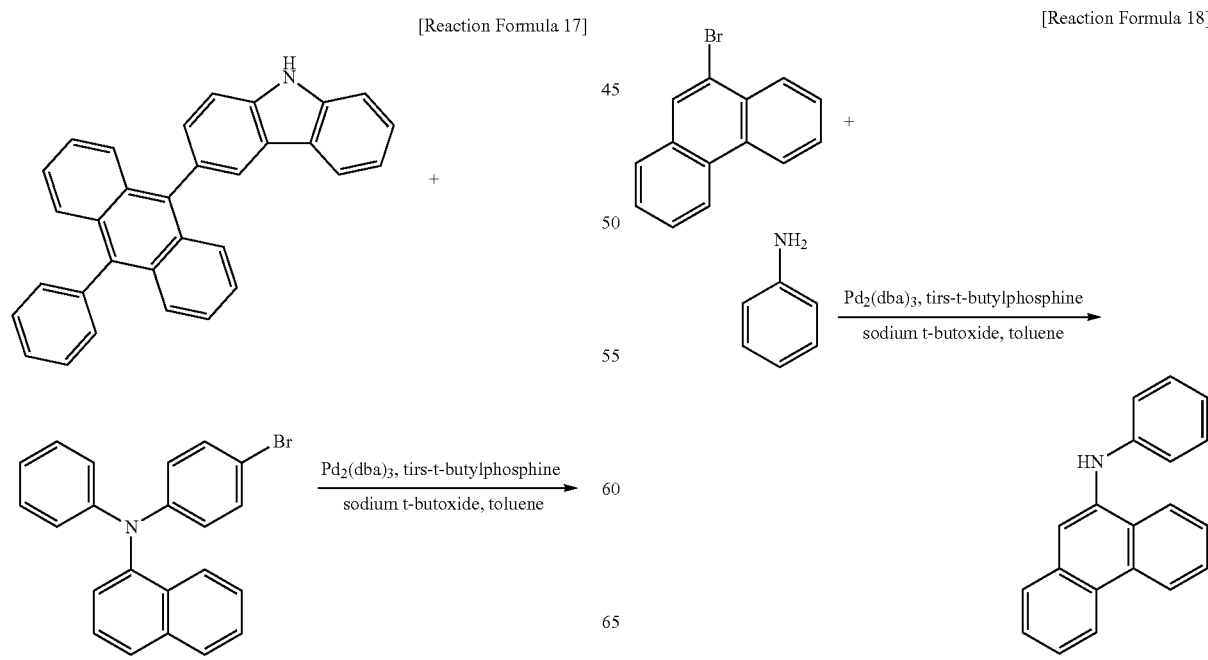

[Reaction Formula 17]

[Reaction Formula 18]

9-bromophenanthrene (7.00 g, 27.22 mmol), aniline (3.7 mL, 40.84 mmol), Pd$_2$(dba)$_3$ (499 mg, 0.544 mmol), tris-t-butylphosphine (0.123 mL, 0.544 mmol), sodium tert-butoxide (3.90 mg, 40.84 mmol) were put in a 250 mL two-neck flask and dissolved in toluene. The solution was refluxed and stirred for 12 hours. After completion of the reaction, the solution was extracted with DI water/methylenechloride and distilled under reduced pressure to remove the solvent. The resultant was columned with a solution of n-hexane and methylenechloride (3:1) and was re-crystallized in a solution of methylene chloride and petroleum ether such that the solid compound was obtained, (4.60 g, yield: 63%).

(2) synthesis of
N-(3-bromophenyl)-N-phenylphenanthren-9-amine

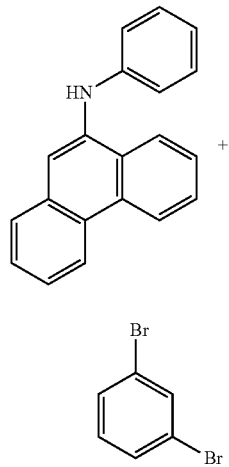

N-phenylphenanthren-9-amine (4.51 g, 16.74 mmol), 1,3-dibromobenzene (6.05 mL, 50.23 mmol), Pd$_2$(dba)$_3$ (307 mg, 0.355 mmol), tris-o-tolyphosphine (0.255 mL, 0.837 mmol), sodium tert-butoxide (3.2 g, 33.49 mmol) were put in a 250 mL two-neck flask and dissolved in toluene. The solution was refluxed and stirred for 12 hours. After completion of the reaction, the solution was extracted with DI water/methylenechloride and distilled under reduced pressure to remove the solvent. The resultant was columned with a solution of n-hexane and methylenechloride (7:1). The resultant was distilled under reduced pressure and re-crystallized such that the wax compound was obtained, (2.9 g, yield: 41%).

(3) Synthesis of the Compound AN-3

[Reaction Formrula 20]

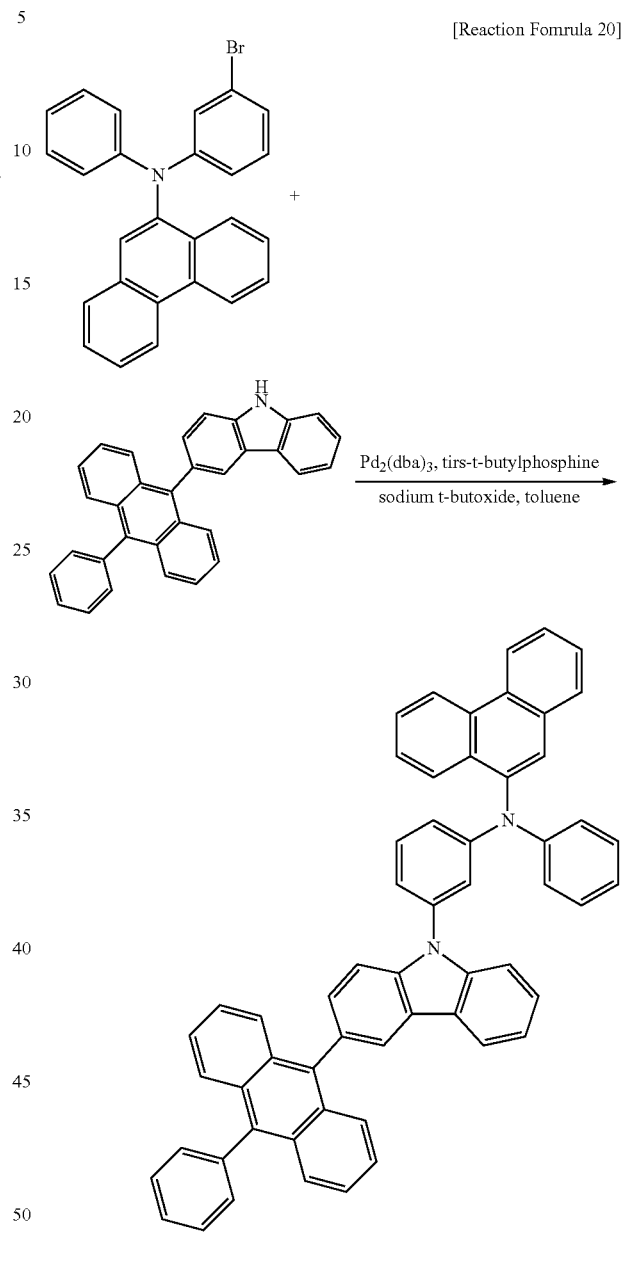

3-(10-phenylanthracen-9-yl)-9H-carbazole (1.25 g, 2.98 mmol), N-(3-bromophenyl)-N-phenylphenanthren-9-amine (1.39 g, 3.28 mmol), Pd$_2$(dba)$_3$ (55 mg, 0.060 mmol), tris-t-butylphosphine (0.014 mL, 0.060 mmol), sodium tert-butoxide (572 mg, 5.96 mmol) were put in a 250 mL two-neck flask and dissolved in toluene. The solution was refluxed and stirred for 12 hours. After completion of the reaction, the solution was extracted with DI water/methylenechloride and distilled under reduced pressure to remove the solvent. The resultant was columned with a solution of n-hexane and methylenechloride (3:1) and was re-crystallized in a solution of methylene chloride and petroleum ether such that the solid compound AN-3 was obtained, (1.14 g, yield: 50%).

4. Synthesis of the Compound AN-4

(1) synthesis of 6-(10-phenylanthracen-9-yl)-9H-pyrido[2,3-b]indole

[Reaction Formula 21]

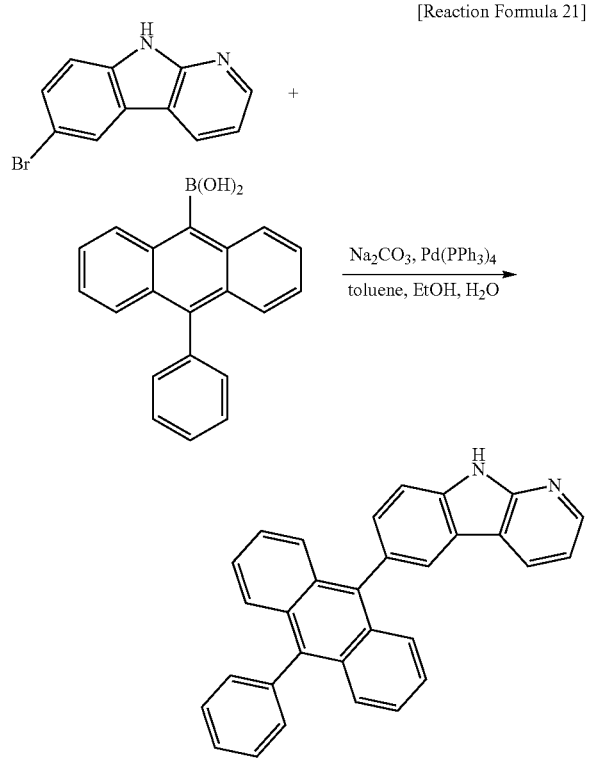

bromo-carboline (3.0 g, 12.14 mmol), 9-phenyl-boronic acid (3.98 g, 13.36 mmol), Na$_2$CO$_3$ (2.57 g, 24.28 mmol), Pd(PPh$_3$)$_4$ (1.40 g, 1.21 mmol) were put in a 250 mL two-neck flask and dissolved in toluene/ethanol/H$_2$O. The solution was refluxed and stirred at 120° C. for 12 hours. After completion of the reaction, the solution was extracted with methylenechloride/H$_2$O and distilled under reduced pressure to remove the solvent. The resultant was columned with a solution of n-hexane and ethylacetate (3:1) and was re-crystallized in a solution of methylene chloride and petroleum ether such that the solid compound was obtained, (2.32 g, yield: 45%).

(2) synthesis of 9-(4-iodophenyl)-6-(10-phenylanthracen-9-yl)-9H-pyrido[2,3-b]indole

[Reaction Formula 22]

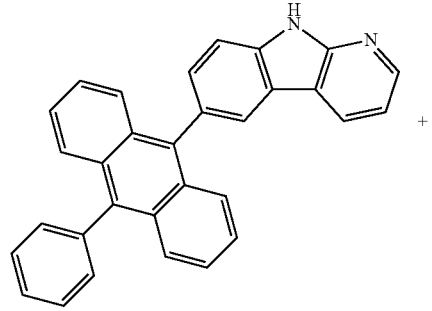

+

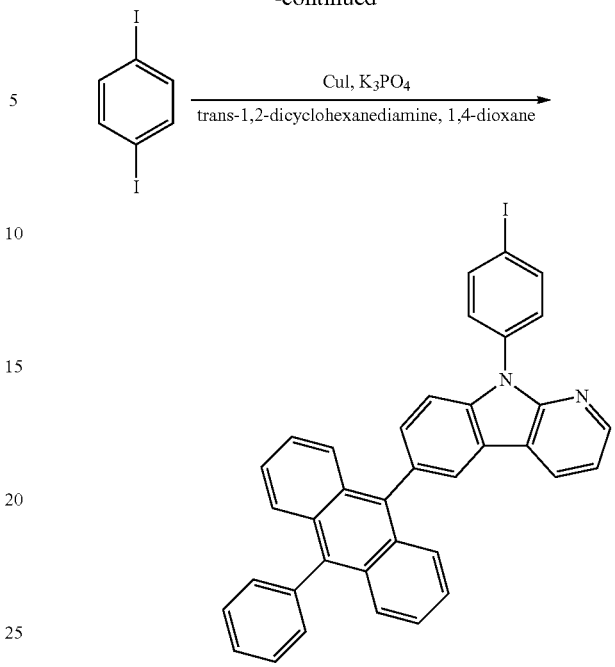

6-(10-phenylanthracen-9-yl)-9H-pyrido[2,3-b]indole (1.76 g, 4.19 mmol), 1,4-diiodobenzene (2.76 g, 8.37 mmol), CuI (319 mg, 1.67 mmol), K$_3$PO$_4$ (1.78 g, 8.37 mmol), trans-1,2-dicyclohexanediamine (0.2 mL, 1.67 mmol) were put in a 250 mL two-neck flask and dissolved in 1,4-dioxane. The solution was refluxed and stirred at 120° C. for 12 hours. After completion of the reaction, the solution was extracted with methylenechloride/H$_2$O and distilled under reduced pressure to remove the solvent. The resultant was columned with a solution of n-hexane and methylenechloride (1:5) and was re-crystallized in a solution of methylene chloride and petroleum ether such that the solid compound was obtained, (1.67 g, yield: 64%).

(3) Synthesis of the Compound AN-4

[Reaction Formula 23]

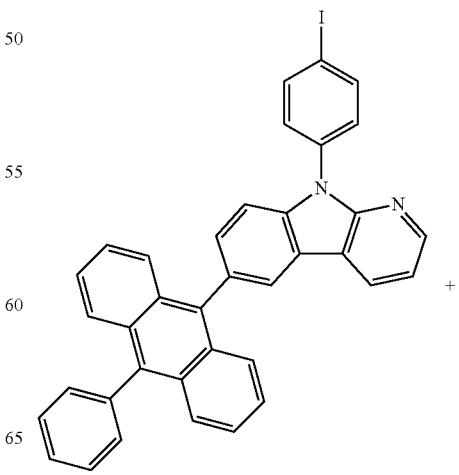

+

-continued

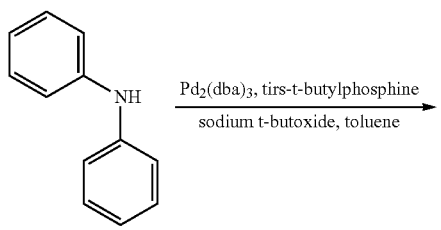

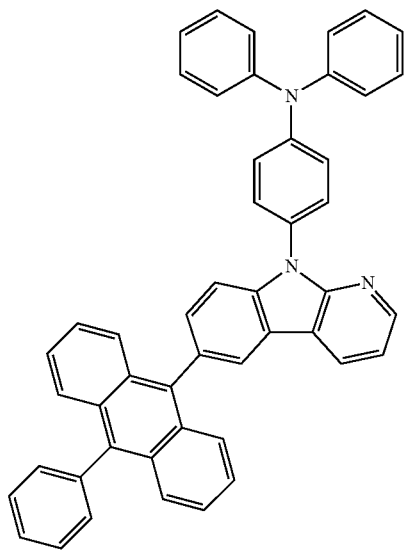

-continued

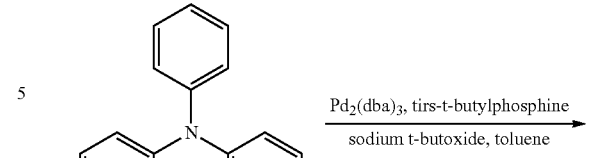

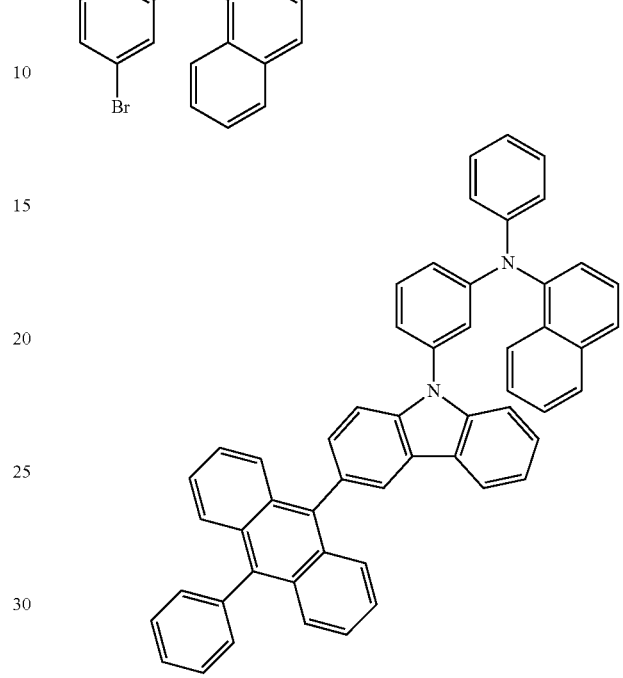

6-(10-phenylanthracen-9-yl)-9H-pyrido[2,3-b]indole (1.58 g, 2.54 mmol), diphenylamine (430 mg, 2.54 mmol), Pd$_2$(dba)$_3$ (46 mg, 0.050 mmol), tris-t-butylphosphine (0.012 mL, 0.050 mmol), sodium tert-butoxide (488 mg, 5.08 mmol) were put in a 250 mL two-neck flask and dissolved in toluene. The solution was refluxed and stirred at 120° C. for 12 hours. After completion of the reaction, the solution was extracted with methylenechloride/H$_2$O and distilled under reduced pressure to remove the solvent. The resultant was columned with a solution of n-hexane and methylenechloride (1:5) and was re-crystallized in a solution of methylene chloride and petroleum ether such that the solid compound AN-4 was obtained, (0.54 g, yield: 32%).

5. Synthesis of the Compound AN-6

3-(10-phenylanthracen-9-yl)-9H-carbazole (1.59 g, 3.80 mmol), N-(3-bromophenyl)-N-phenyl-naphthalen-1-amine (1.56 g, 4.17 mmol), Pd2(dba)3 (69 mg, 0.076 mmol), tris-t-butylphosphine (27 µl, 0.114 mmol), sodium tert-butoxide (728 mg, 7.58 mmol) were put in a 250 mL two-neck flask and dissolved in toluene. The solution was refluxed and stirred for 12 hours. After completion of the reaction, the solution was distilled under reduced pressure to remove the solvent. The resultant was columned with a solution of hexane and ethylacetate (3:1). The solution was distilled under reduced pressure and was re-crystallized in a solution of methylene chloride and petroleum ether such that the compound AN-6 of greenish solid was obtained, (1.64 g, yield: 61%).

6. Synthesis of the Compound AN-8

(1) Synthesis of 9-(3-iodophenyl)-6-(10-phenylanthracen-9-yl)-9H-pyrido[2,3-b]indole

[Reaction Formula 24]

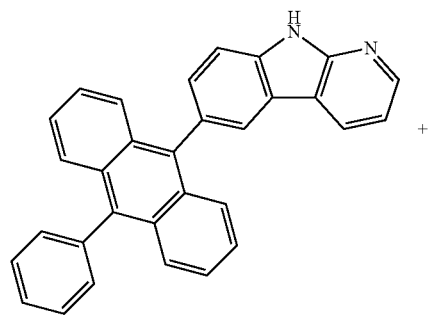 +

[Reaction Formula 25]

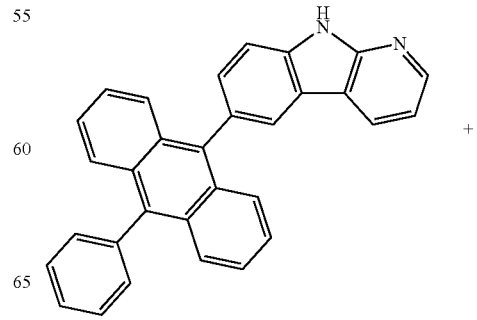 +

-continued

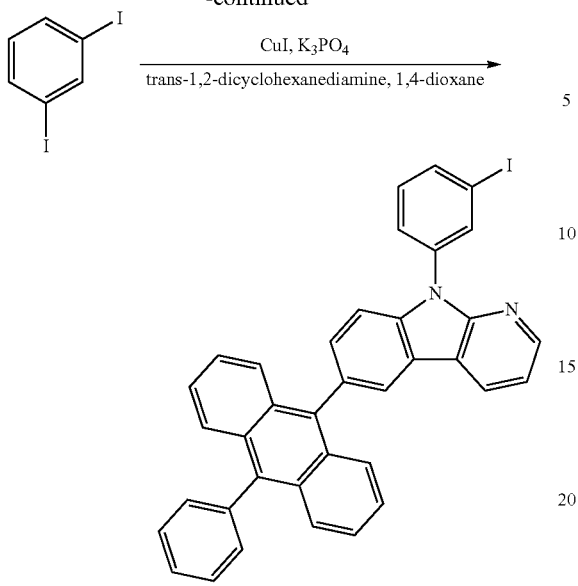

6-(10-phenylanthracen-9-yl)-9H-pyrido[2,3-b]indole (1.76 g, 4.19 mmol), 1,3-diiodobenzene (2.76 g, 8.37 mmol), CuI (319 mg, 1.67 mmol), K3PO4 (1.78 g, 8.37 mmol), trans-1,2-dicyclohexanediamine (0.2 mL, 1.67 mmol) were put in a 250 mL two-neck flask and dissolved in 1,4-dioxane. The solution was refluxed and stirred at 120° C. for 12 hours. After completion of the reaction, the solution was extracted with methylenechloride and H₂O and was distilled under reduced pressure to remove the solvent. The resultant was columned with a solution of hexane and methylenechloride (1:5). The solution was re-crystallized in a solution of methylene chloride and petroleum ether such that the white solid compound was obtained, (1.66 g, yield: 63%).

(2) Synthesis of the Compound AN-8

[Reaction Formula 26]

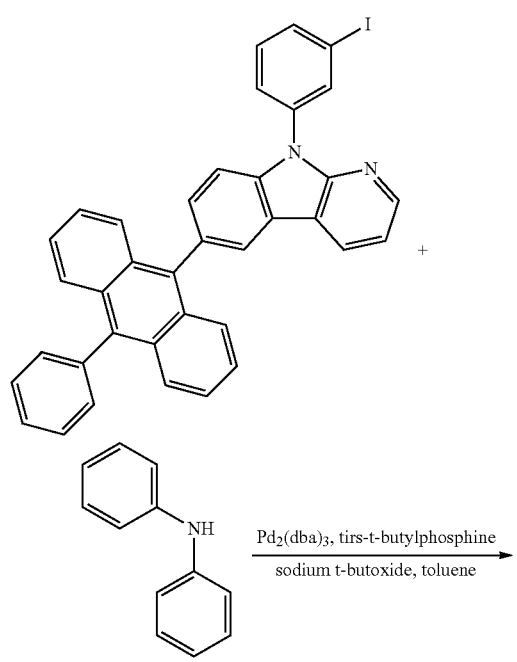

-continued 9-(3-iodophenyl)-6-(10-phenylanthracen-9-yl)-9H-pyrido[2,3-b]indole (1.58 g, 2.54 mmol), diphenylamine (430 mg, 2.54 mmol), Pd2(dba)3 (46 mg, 0.050 mmol), tris-t-butylphosphine (0.012 mL, 0.050 mmol), sodium tert-butoxide (488 mg, 5.08 mmol) were put in a 250 mL two-neck flask and dissolved in toluene. The solution was refluxed and stirred at 120° C. for 12 hours. After completion of the reaction, the solution was extracted with H₂O and was distilled under reduced pressure to remove the solvent. The resultant was columned with a solution of hexane and methylenechloride (1:5). The solution was distilled under reduced pressure and was re-crystallized in a solution of methylene chloride and petroleum ether such that the compound AN-8 of solid was obtained, (0.53 g, yield: 31%).

7. Synthesis of the Compound AN-11

(1) synthesis of diphenanthren-9-ylamine

[Reaction Formula 27]

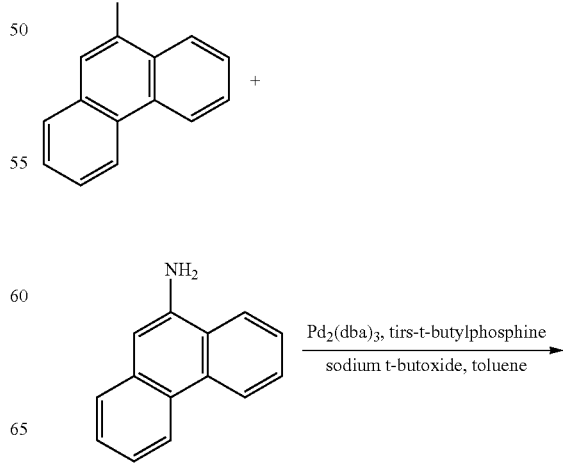

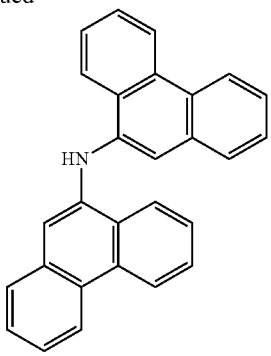

9-bromophenanthrene (7.00 g, 27.22 mmol), phenanthren-9-amine (5.26 g, 27.22 mmol), Pd2(dba)3 (499 mg, 0.544 mmol), tris-t-butylphosphine (0.123 mL, 0.544 mmol), sodium tert-butoxide (3.90 mg, 40.84 mmol) were put in a 250 mL two-neck flask and dissolved in toluene. The solution was refluxed and stirred for 12 hours. After completion of the reaction, the solution was extracted with DI water/methylenechloride and distilled under reduced pressure to remove the solvent. The resultant was columned with a solution of n-hexane and methylenechloride (3:1) and was re-crystallized in a solution of methylene chloride and petroleum ether such that the solid compound was obtained, (4.50 g, yield: 45%).

(2) synthesis of N-(4-bromophenyl)-N-(phenanthren-9-yl)phenanthren-9-amine

[Reaction Formula 28]

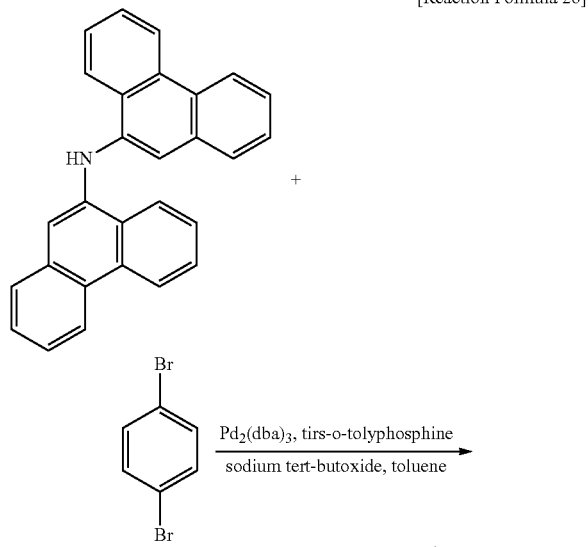

Diphenanthren-9-ylamine (4.50 g, 12.18 mmol), 1,4-dibromobenzene (3.02 mL, 25.12 mmol), Pd2(dba)3 (307 mg, 0.355 mmol), tris-o-tolyphosphine (0.255 mL, 0.837 mmol), sodium tert-butoxide (3.2 g, 33.49 mmol) were put in a 250 mL two-neck flask and dissolved in toluene. The solution was refluxed and stirred for 12 hours. After completion of the reaction, the solution was extracted with DI water/methylenechloride and distilled under reduced pressure to remove the solvent. The resultant was columned with a solution of n-hexane and methylenechloride (7:1). The resultant was distilled under reduced pressure and re-crystallized such that the wax compound was obtained, (2.8 g, yield: 44%).

(3) Synthesis of the Compound AN-11

[Reaction Formula 29]

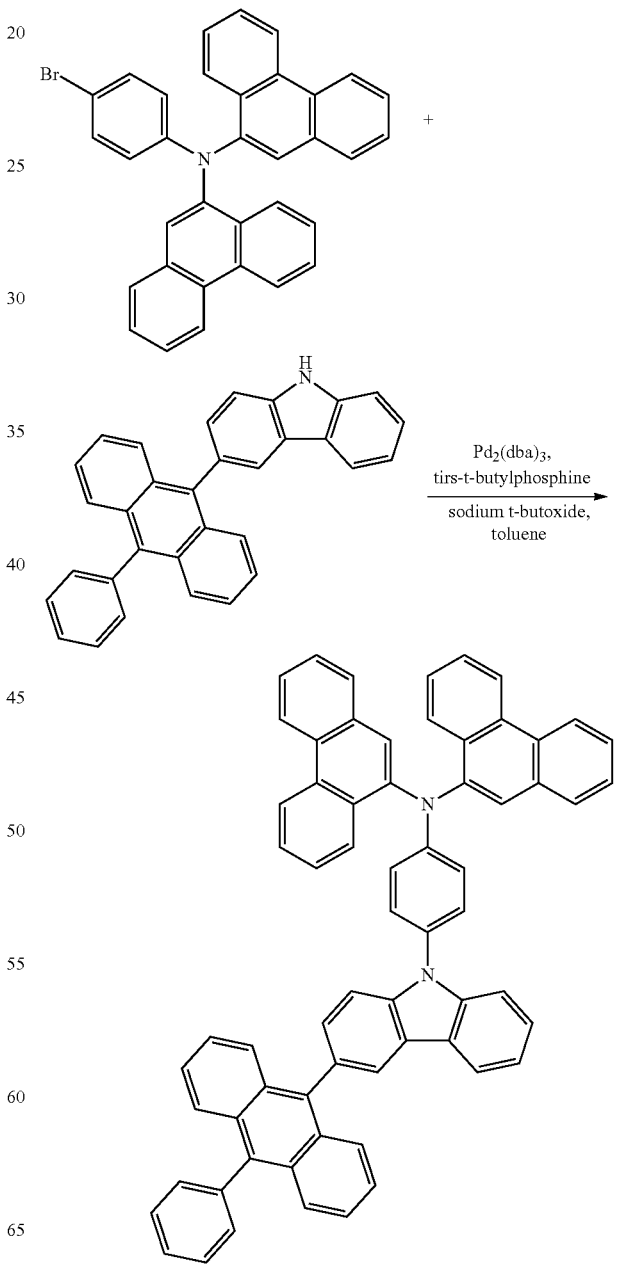

3-(10-phenylanthracen-9-yl)-9H-carbazole (1.25 g, 2.98 mmol), N-(4-bromophenyl)-N-phenylphenanthren-9-amine (1.56 g, 2.98 mmol), Pd2(dba)3 (55 mg, 0.060 mmol), tris-t-butylphosphine (0.014 mL, 0.060 mmol), sodium tert-butoxide (572 mg, 5.96 mmol) were put in a 250 mL two-neck flask and dissolved in toluene. The solution was refluxed and stirred for 12 hours. After completion of the reaction, the solution was extracted with DI water/methylenechloride and distilled under reduced pressure to remove the solvent. The resultant was columned with a solution of n-hexane and methylenechloride (5:1). The solution was distilled under reduced pressure and was re-crystallized in a solution of methylene chloride and petroleum ether such that the solid compound AN-11 was obtained, (1.14 g, yield: 44%).

The properties of the compounds AN-1 to AN-4, AN-6, AN-8 and AN-11 and a host compound (Host (ref.)) in Formula 4 were tested and listed in Table 3.

[Formula 4]

TABLE 3

| Compounds | $\lambda_{abs}{}^a$ (nm) | $\lambda_{PL}{}^b$ (nm) | Band gap Energy $^c$ | LUMO $^d$ (eV) | HOMO $^e$ (eV) |
|---|---|---|---|---|---|
| Host (ref.) | 417 | 421 | 3.00 | −2.50 | −5.50 |
| AN-1 | 419 | 434 | 2.96 | −2.30 | −5.26 |
| AN-2 | 422 | 451 | 2.94 | −2.21 | −5.15 |
| AN-3 | 419 | 431 | 2.96 | −2.55 | −5.51 |
| AN-4 | 418 | 436 | 2.97 | −2.30 | −5.27 |
| AN-6 | 419 | 451 | 2.96 | −2.23 | −5.19 |
| AN-8 | 415 | 436 | 2.99 | −2.28 | −5.27 |
| AN-11 | 419 | 431 | 2.96 | −2.63 | −5.59 |

$^a$Absorption onset of 0.02 mM solutions in CH$_2$Cl$_2$.
$^b$PL maxima of 2-methyl THF solutions upon excitation at UV maximum absorption.
$^c$Estimated from the absorption onset.
$^d$LUMO = −[Band gap energy − HOMO level]
$^e$Estimated from the Cyclic Voltammetry instrument.

Example 3

Diode Structure

An indium-tin-oxide (ITO) layer is patterned on a substrate and washed such that an emission area of the ITO layer is to be 3 mm*3 mm. The substrate is washed by the UV ozone and is loaded in an evaporation system. The substrate is loaded in a vacuum chamber, and the process pressure is adjusted to $1*10^{-6} \sim 1*10^{-7}$ torr. On the ITO layer, i) HIL (50 Å, host material/HAT-CN (10%)), ii) HTL (300 Å, host material), iii) EML (700 Å, host material/dopant material (15%)), iv) ETL (200 Å, Alq3), v) EIL (10 Å, LiF), and vi) cathode (1000 Å, Al) are sequentially deposited. The UV curable epoxy and the getter are used for encapsulation such that the diode is obtained. The dopant material for the EML is N,N'-bis(2,4-diphenyl)-N,N'-bis(2-fluorophenyl)-pyrene-1,6-diamine.

1. Comparative Example Diode (Ref.)

The compound in Formula 4 is used the host material of the EIL, the ETL and the EML.

2. AN-1 Diode

The compound AN-1 is used the host material of the EIL, the ETL and the EML.

3. AN-3 Diode

The compound AN-3 is used the host material of the EIL, the ETL and the EML.

4. AN-6 Diode

The compound AN-6 is used the host material of the EIL, the ETL and the EML.

5. AN-8 Diode

The compound AN-8 is used the host material of the EIL, the ETL and the EML.

6. AN-11 Diode

The compound AN-11 is used the host material of the EIL, the ETL and the EML.

The above diodes are fabricated with the same conditions except the host material of the EIL, the ETL and the EML. The properties of the diodes were tested and listed in Table 4.

TABLE 4

| | @10 mA/cm$^2$ | | | | | | |
|---|---|---|---|---|---|---|---|
| Host | Volt(V) | Cd/A | lm/W | EQE (%) | cd/m$^2$(max) | CIE x | CIE y |
| Ref. | 3.19 | 1.01 | 0.99 | 1.17 | 100 | 0.144 | 0.098 |
| AN-1 | 2.98 | 4.30 | 4.53 | 4.46 | 453 | 0.147 | 0.116 |
| AN-3 | 2.99 | 4.12 | 4.33 | 4.53 | 433 | 0.143 | 0.107 |
| AN-6 | 3.00 | 4.04 | 4.23 | 3.61 | 423 | 0.145 | 0.144 |
| AN-8 | 3.10 | 1.91 | 1.93 | 2.42 | 193 | 0.144 | 0.087 |
| AN-11 | 3.12 | 3.91 | 3.94 | 4.15 | 394 | 0.147 | 0.111 |

Referring to Table 4, in comparison to the Comparative Example (Ref.), the diode including the organic compounds AN-1, AN-3, AN-6, AN-8 and AN-11 of the embodiment of the invention has advantages in the driving voltage, the emission efficiency, and so on. Since the organic compound has an excellent hole injection and/or transporting property, the combination of the holes and the electrons is generated at a center region of the EML such that the emission efficiency is improved.

Namely, referring to Table 3, the organic compounds of the embodiment of the invention and the reference host have similar properties, e.g., LUMO and HOMO. However, the reference host has a strong electron property such that the hole injection and/or transportation is restricted by the reference host. On the other hand, since the organic compound of the embodiment of the invention has a strong hole property, the hole injection and/or transportation becomes easier. As a result, in the OLED including the organic compound of the embodiment of the invention, the combination of the holes and the electrons is generated at a center region of the EML such that the emission efficiency is improved.

In addition, since the organic compounds of the embodiment of the invention can be used for all of the HIL, the HTL and the EML, the structure and the fabricating process of the OLED are simplified.

It will be apparent to those skilled in the art that various modifications and variations can be made in the embodiment of the invention without departing from the spirit or scope of the invention. Thus, it is intended that the embodiment of the invention cover the modifications and variations of this invention provided they come within the scope of the appended claims and their equivalents.

What is claimed is:

1. An organic electroluminescent device, comprising:
a first electrode;
a second electrode facing the first electrode;
a first charge carrying layer disposed between the first electrode and the second electrode, the first charge carrying layer being disposed adjacent to the first electrode; and
a second charge carrying layer disposed between the first electrode and the second electrode, the second charge carrying layer disposed adjacent to the second electrode,
wherein the first charge carrying layer includes an emitting sub-layer, a hole injection sub-layer and a hole transporting sub-layer between the hole injection sub-layer and the emitting sub-layer,
wherein the hole injection sub-layer includes an organic compound of Formula:

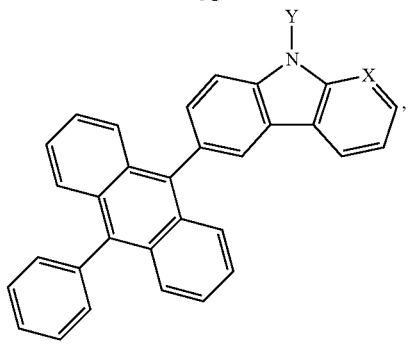

wherein X is selected from carbon and nitrogen, and Y is selected from aryl and arylamine, and wherein the hole injection sub-layer further includes an organic material of Formula:

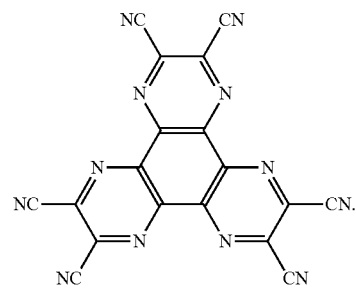 [SMILES: N#Cc1nc2c3nc(C#N)c(C#N)nc3c3nc(C#N)c(C#N)nc3c2nc1C#N]

2. The organic electroluminescent device according to claim 1, wherein the Y is selected from phenyl, naphthyl, terphenyl, xylene, triphenlyamine, diphenylamine and phenanthrenylamine.

3. The organic electroluminescent device according to claim 1, wherein the organic compound of the Formula is selected from the followings:

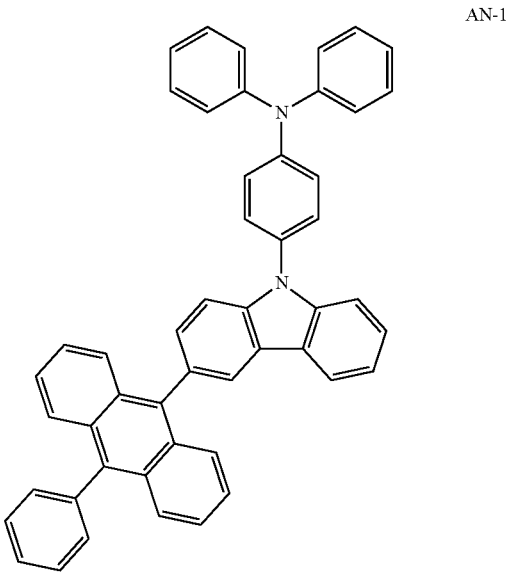

AN-1

-continued
AN-2
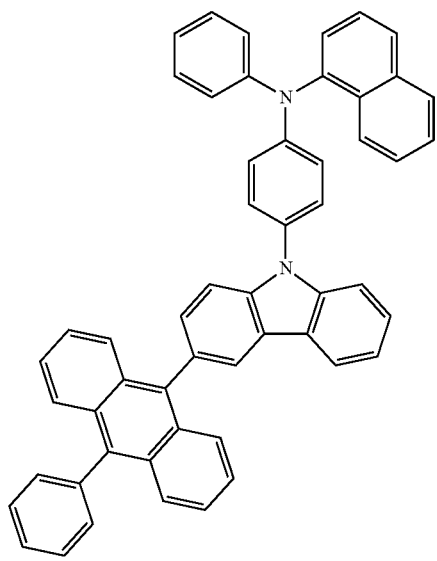
AN-4
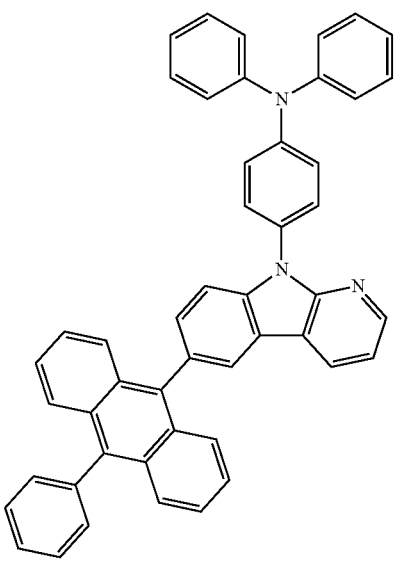
AN-3
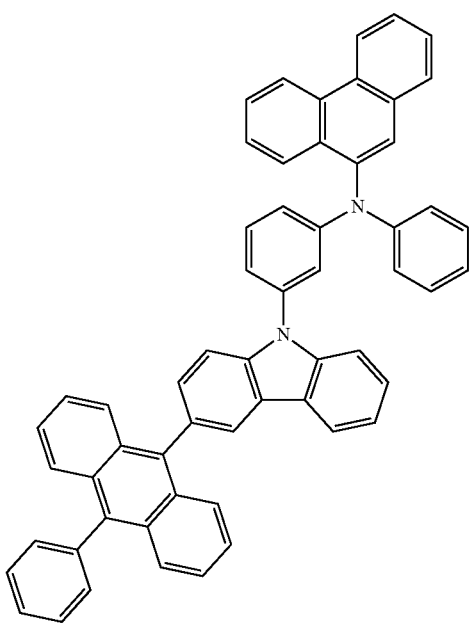
AN-5
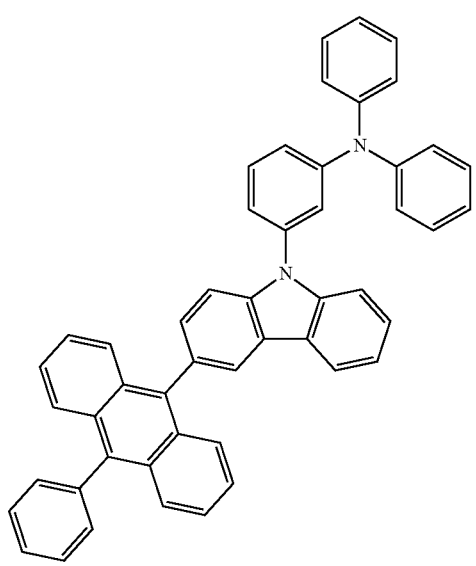

-continued
AN-6
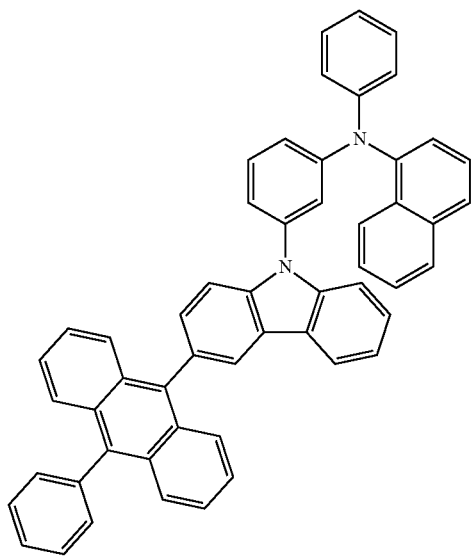
AN-8
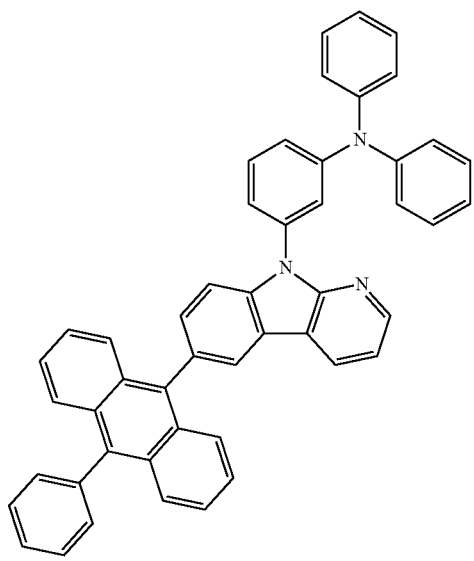
AN-7
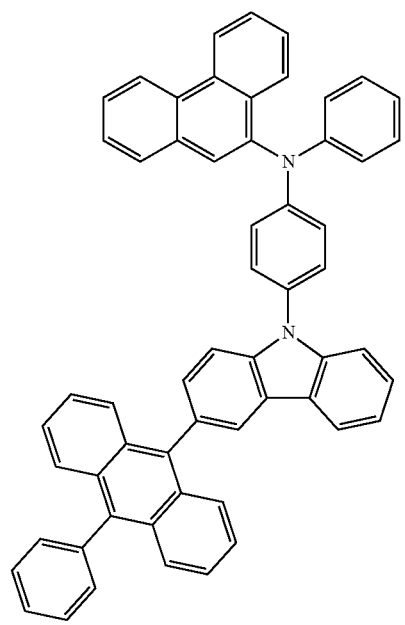
AN-9
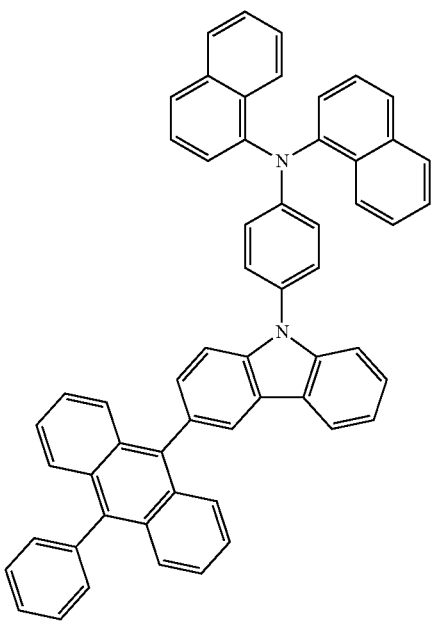

AN-10
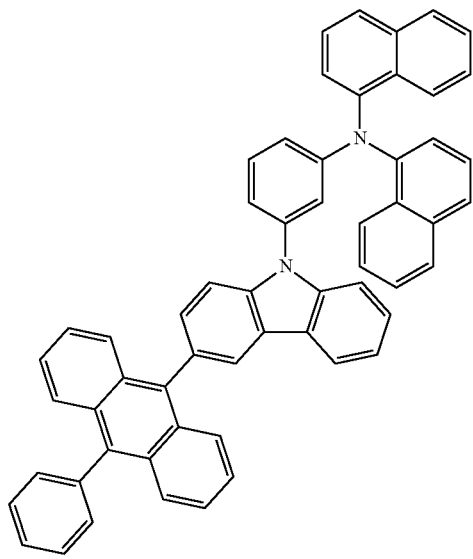
AN-11
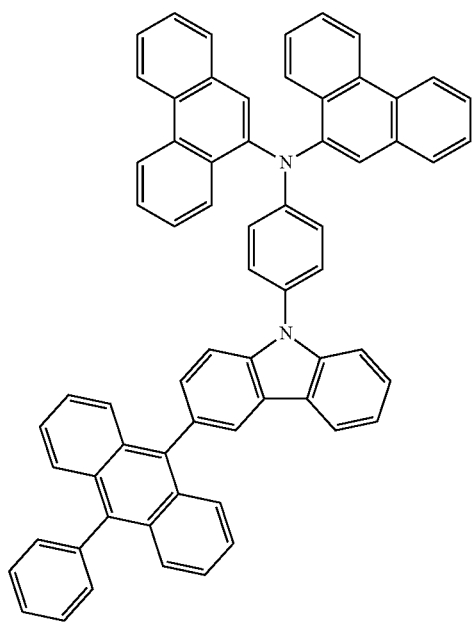
AN-12
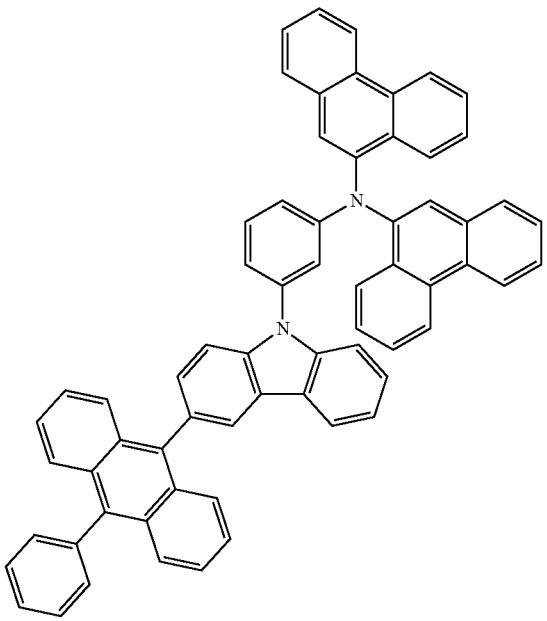
AN-13
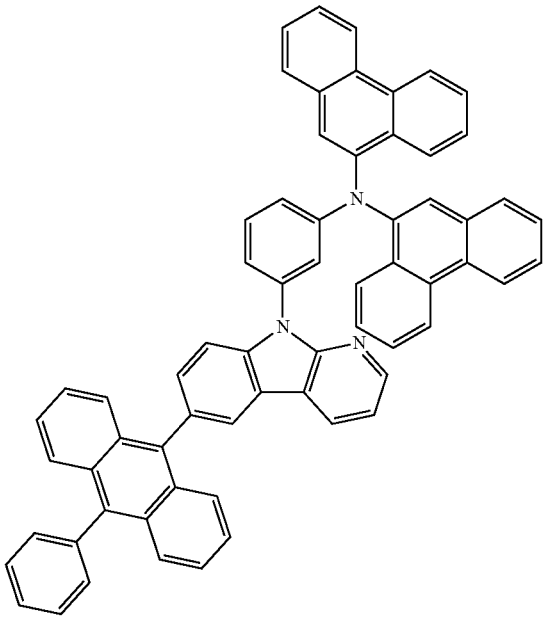

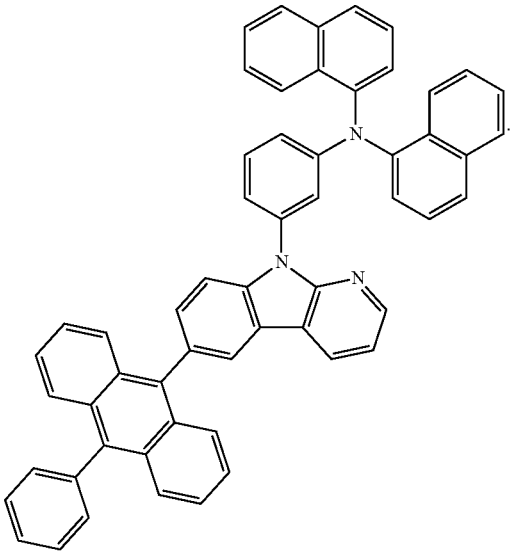

AN-14

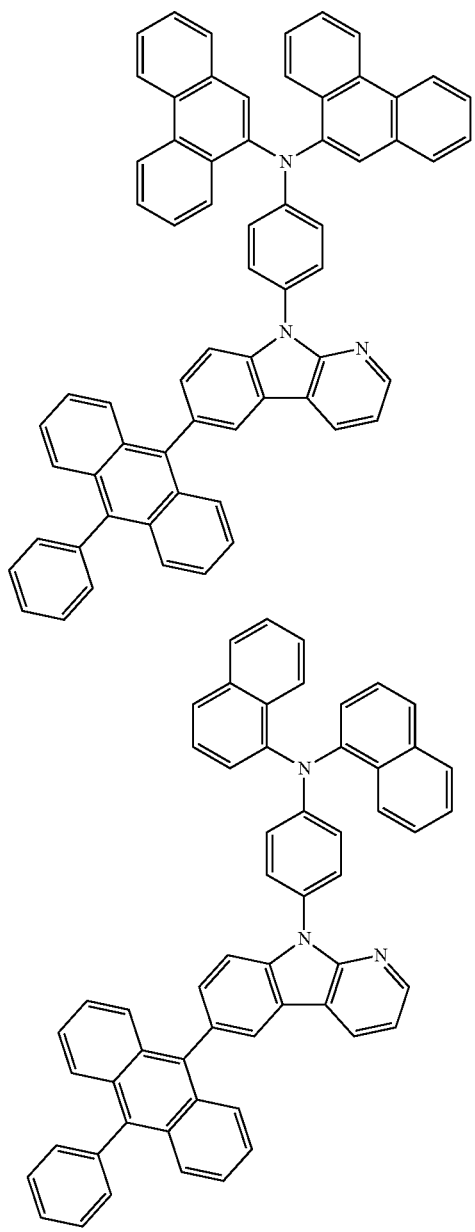

AN-15

AN-16

4. The organic electroluminescent device according to claim 1, wherein the hole transporting sub-layer includes the organic compound of the Formula.

5. The organic electroluminescent device according to claim 1, wherein the emitting sub-layer includes the organic compound as a host material and a dopant material doped to the host material.

6. The organic electroluminescent device according to claim 1, wherein the organic material of the Formula has 0.1 to 20 weight % with respect to a total weight of the hole injection sub-layer.

* * * * *